United States Patent
Hadwen et al.

(10) Patent No.: US 10,981,168 B2
(45) Date of Patent: *Apr. 20, 2021

(54) AM-EWOD ARRAY ELEMENT CIRCUITRY WITH INTEGRATED SENSING AND METHOD OF SENSING DROPLET MERGING

(71) Applicant: Sharp Life Science (EU) Limited, Oxford (GB)

(72) Inventors: Benjamin James Hadwen, Oxford (GB); Oliver James Beard, Oxford (GB)

(73) Assignee: Sharp Life Science (EU) Limited, Oxford (GB)

( * ) Notice: Subject to any disclaimer, the term of this patent is extended or adjusted under 35 U.S.C. 154(b) by 125 days.

This patent is subject to a terminal disclaimer.

(21) Appl. No.: 16/207,836

(22) Filed: Dec. 3, 2018

(65) Prior Publication Data

US 2020/0171500 A1 Jun. 4, 2020

(51) Int. Cl.
*B01L 3/00* (2006.01)
*G01N 27/02* (2006.01)
*G01R 27/22* (2006.01)

(52) U.S. Cl.
CPC ..... *B01L 3/502792* (2013.01); *B01L 3/50273* (2013.01); *B01L 3/502715* (2013.01);
(Continued)

(58) Field of Classification Search
CPC ........ G09G 3/348; G09G 3/006; G01R 27/22; B01L 3/50273; B01L 3/502792; G02B 26/005
See application file for complete search history.

(56) References Cited

U.S. PATENT DOCUMENTS 7,163,612 B2 1/2007 Sterling et al.
8,173,000 B1 5/2012 Hadwen et al.
(Continued)

FOREIGN PATENT DOCUMENTS

CN 107583694 1/2018

OTHER PUBLICATIONS

Fair, R.B., "Digital microfluids: is a true lab-on-a-chip possible?" Microfluidics and Nanofluidics Jun. 2007, vol. 3, Issue 3, pp. 245-281.
(Continued)

*Primary Examiner* — Angelo Trivisonno
(74) *Attorney, Agent, or Firm* — Renner, Otto, Boisselle & Sklar, LLP

(57) ABSTRACT

A method of operating an active matrix electro-wetting on dielectric (AM-EWOD) device provides for enhanced mutual capacitance sensing using integrated impedance sensing circuitry. Array element circuitry of each array element includes actuation circuitry configured to apply actuation voltages to the array element electrode for actuating the array element, and impedance sensor circuitry integrated into the array element circuitry and configured to sense impedance at the array element electrode. The method of operating includes the steps of: perturbing a voltage applied to the array element electrode of a first array element; coupling the voltage perturbation to the array element electrode of a second array element different from the first array element; and measuring the output current from the sensor readout transistor of the second array element for sensing in response to the voltage perturbation. The method may be performed by an AM-EWOD control system executing program code stored on a non-transitory computer readable medium.

24 Claims, 24 Drawing Sheets

(52) U.S. Cl.
CPC .......... *G01N 27/028* (2013.01); *G01R 27/22* (2013.01); *B01L 2300/0819* (2013.01); *B01L 2400/0427* (2013.01)

(56) References Cited

U.S. PATENT DOCUMENTS

| | | | |
|---|---|---|---|
| 8,653,832 | B2 | 2/2014 | Hadwen et al. |
| 2012/0006684 | A1* | 1/2012 | Hadwen ................ G09G 3/348 |
| | | | 204/600 |
| 2012/0106238 | A1 | 5/2012 | John et al. |
| 2012/0194492 | A1 | 8/2012 | Hadwen et al. |
| 2014/0151232 | A1 | 6/2014 | Hadwen |
| 2017/0056887 | A1 | 3/2017 | Hadwen et al. |
| 2017/0074814 | A1* | 3/2017 | Hadwen ............ B01L 3/502792 |
| 2017/0076676 | A1* | 3/2017 | Hadwen ............... G02B 26/005 |
| 2017/0139513 | A1* | 5/2017 | Hong ................ G02F 1/134336 |
| 2018/0078934 | A1 | 3/2018 | Hadwen et al. |
| 2019/0070602 | A1 | 3/2019 | Han et al. |

OTHER PUBLICATIONS

F Azam Shaik et al., "Thin-film-transistor array: an exploratory attempt for high throughput cell manipulation using electrowetting principle", 2017 J. Micromech. Microeng. 27 054001.

Martel et al., "Handling of artificial membranes using electrowetting-actuated droplets on a microfluidic device combined with integrated pA-measurements", Biomicrofluidics 6, 012813 (2012).

\* cited by examiner

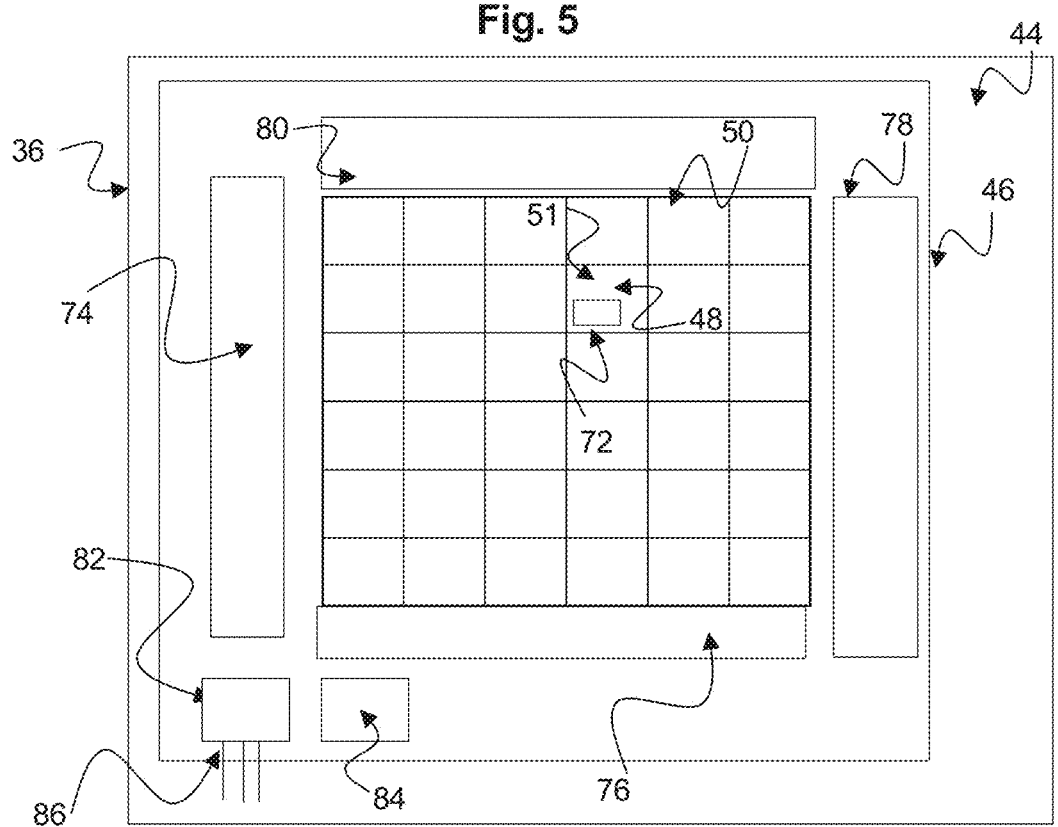

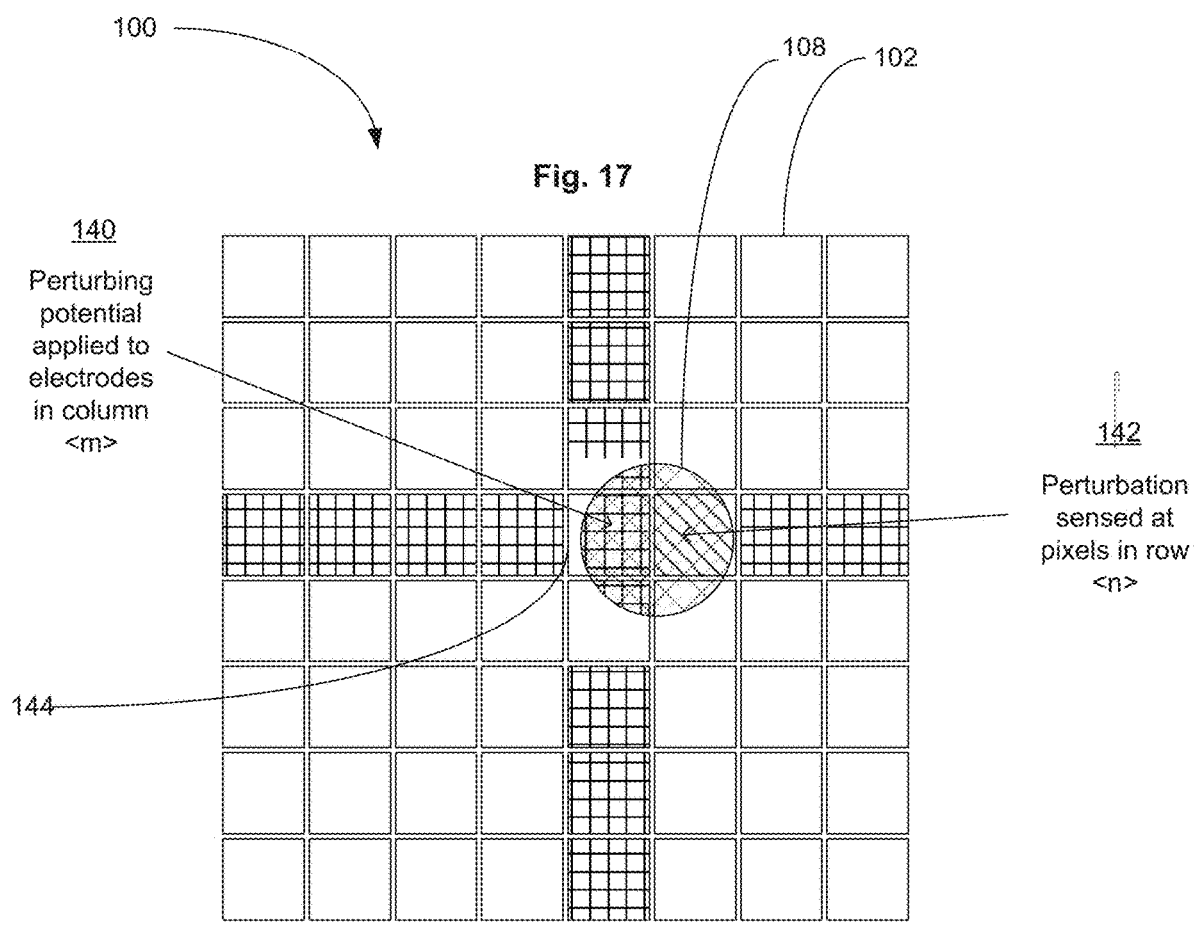

Fig. 18

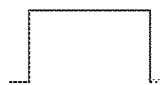
RST<n+1>

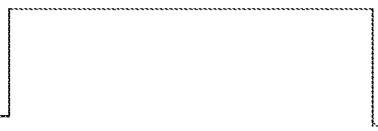
GL<n>

SL<m>

Potential at Electrode<n,m>

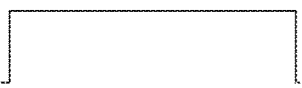
Potential at Electrode<n+1>
- case where a droplet spans the gap between electrodes in rows <n> and <n+1>

Potential at Electrode<n+1>
- case where no droplet spans the gap between electrodes in rows <n> and <n+1>

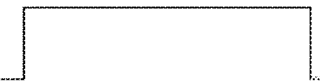
Current through COL
- case where a droplet spans the gap between electrodes in rows <n> and <n+1>

Current through COL
- case where no droplet spans the gap between electrodes in rows <n> and <n+1>

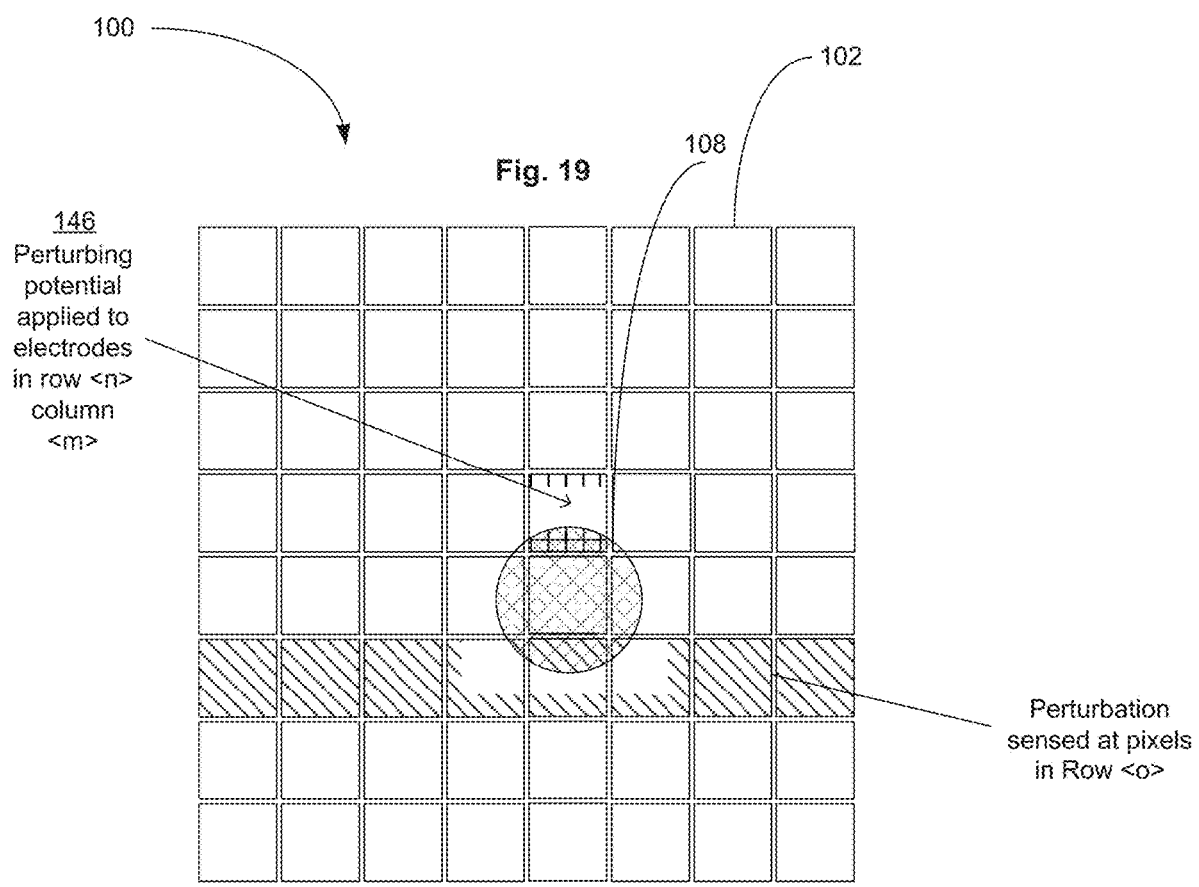

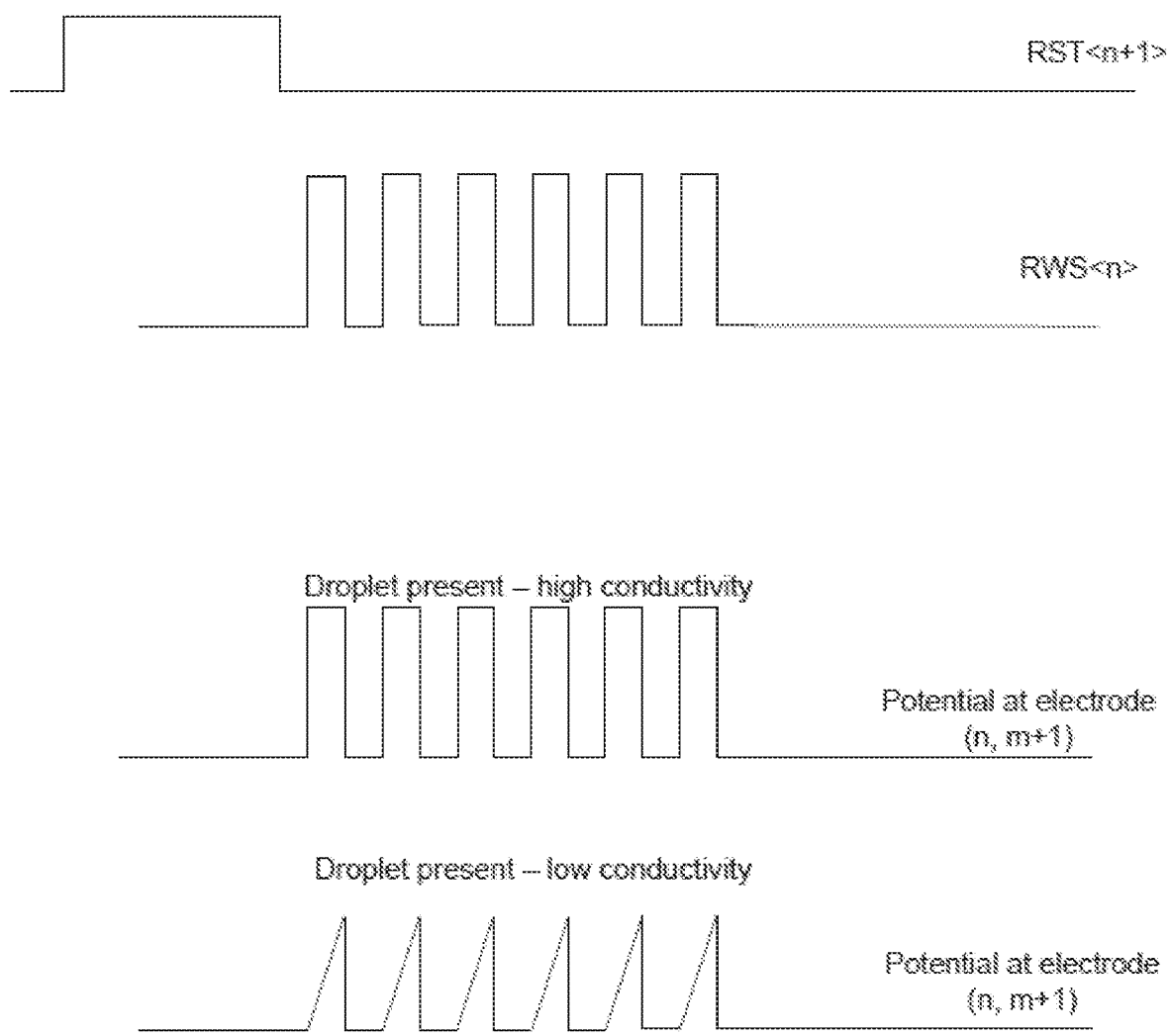

AM-EWOD ARRAY ELEMENT CIRCUITRY WITH INTEGRATED SENSING AND METHOD OF SENSING DROPLET MERGING

TECHNICAL FIELD

The present invention relates to droplet microfluidic devices, and more specifically to Active Matrix Electrowetting-On-Dielectric (AM-EWOD) devices and to configurations of the array element circuitry of the array elements of such a device to optimize droplet sensing capabilities.

BACKGROUND ART

Electrowetting on dielectric (EWOD) is a well-known technique for manipulating droplets of fluid by application of an electric field. Active Matrix EWOD (AM-EWOD) refers to implementation of EWOD in an active matrix array incorporating transistors, for example by using thin film transistors (TFTs). It is thus a candidate technology for digital microfluidics for lab-on-a-chip technology. An introduction to the basic principles of the technology can be found in "Digital microfluidics: is a true lab-on-a-chip possible?", R. B. Fair, Microfluid Nanofluid (2007) 3:245-281).

FIG. 1 is a drawing depicting an exemplary EWOD based microfluidic system. In the example of FIG. 1, the microfluidic system includes a reader 32 and a cartridge 34. The cartridge 34 may contain a microfluidic device, such as an AM-EWOD device 36, as well as (not shown) fluid input ports into the device and an electrical connection as are conventional. The fluid input ports may perform the function of inputting fluid into the AM-EWOD device 36 and generating droplets within the device, for example by dispensing from input reservoirs as controlled by electrowetting. As further detailed below, the microfluidic device includes an electrode array configured to receive the inputted fluid droplets.

The microfluidic system further may include a control system configured to control actuation voltages applied to the electrode array of the microfluidic device to perform manipulation operations to the fluid droplets. For example, the reader 32 may contain such a control system configured as control electronics 38 and a storage device 40 that may store any application software and any data associated with the system. The control electronics 38 may include suitable circuitry and/or processing devices that are configured to carry out various control operations relating to control of the AM-EWOD device 36, such as a CPU, microcontroller or microprocessor.

In the example of FIG. 1, an external sensor module 35 is provided for sensor droplet properties. For example, optical sensors as are known in the art may be employed as external sensors for sensing droplet properties. Suitable optical sensors include camera devices, light sensors, charged coupled devices (CCD) and similar image sensors, and the like. A sensor additionally or alternatively may be configured as internal sensor circuitry incorporated as part of the drive circuitry in each array element. Such sensor circuitry may sense droplet properties by the detection of an electrical property at the array element, such as impedance or capacitance.

FIG. 2 is a drawing depicting additional details of the exemplary AM-EWOD device 36 in a perspective view. The AM-EWOD device 36 has a lower substrate assembly 44 with thin film electronics 46 disposed upon the lower substrate assembly 44. The thin film electronics 46 are arranged to drive array element electrodes 48. A plurality of array element electrodes 48 are arranged in an electrode or element two-dimensional array 50, having N rows by M columns of array elements where N and M may be any integer. A liquid droplet 52 which may include any polar liquid and which typically may be aqueous, is enclosed between the lower substrate 44 and a top substrate 54 separated by a spacer 56, although it will be appreciated that multiple liquid droplets 52 can be present.

FIG. 3 is a drawing depicting a cross section through some of the array elements of the exemplary AM-EWOD 36 device of FIG. 2. In the portion of the AM-EWOD device depicted in FIG. 3, the device includes a pair of the array element electrodes 48A and 48B that are shown in cross section that may be utilized in the electrode or element array 50 of the AM-EWOD device 36 of FIG. 3. The AM-EWOD device 36 further incorporates the thin-film electronics 46 disposed on the lower substrate 44, which is separated from the upper substrate 54 by the spacer 56. The uppermost layer of the lower substrate 44 (which may be considered a part of the thin film electronics layer 46) is patterned so that a plurality of the array element electrodes 48 (e.g. specific examples of array element electrodes are 48A and 48B in FIG. 3) are realized. The term element electrode 48 may be taken in what follows to refer both to the physical electrode structure 48 associated with a particular array element, and also to the node of an electrical circuit directly connected to this physical structure. A reference electrode 58 is shown in FIG. 3 disposed upon the top substrate 54, but the reference electrode alternatively may be disposed upon the lower substrate 44 to realize an in-plane reference electrode geometry. The term reference electrode 58 may also be taken in what follows to refer to both or either of the physical electrode structure and also to the node of an electrical circuit directly connected to this physical structure.

In the AM-EWOD device 36, a non-polar fluid 60 (e.g. oil) may be used to occupy the volume not occupied by the liquid droplet 52. An insulator layer 62 may be disposed upon the lower substrate 44 that separates the conductive element electrodes 48A and 48B from a first hydrophobic coating 64 upon which the liquid droplet 52 sits with a contact angle 66 represented by θ. The hydrophobic coating is formed from a hydrophobic material (commonly, but not necessarily, a fluoropolymer). On the top substrate 54 is a second hydrophobic coating 68 with which the liquid droplet 52 may come into contact. The reference electrode 58 is interposed between the top substrate 54 and the second hydrophobic coating 68.

The contact angle θ for the liquid droplet is defined as shown in FIG. 3, and is determined by the balancing of the surface tension components between the solid-liquid ($\gamma_{SL}$), liquid-gas ($\gamma_{LG}$) and non-ionic fluid ($\gamma_{SG}$) interfaces, and in the case where no voltages are applied satisfies Young's law, the equation being given by:

$$\cos\theta = \frac{\gamma_{SG} - \gamma_{SL}}{\gamma_{LG}} \quad \text{(equation 1)}$$

In operation, voltages termed the EW drive voltages, (e.g. $V_T$, $V_0$ and $V_{00}$ in FIG. 3) may be externally applied to different electrodes (e.g. reference electrode 58, element electrodes 48A and 48A, respectively). The resulting electrical forces that are set up effectively control the hydrophobicity of the hydrophobic coating 64. By arranging for different EW drive voltages (e.g. $V_O$ and $V_{OO}$) to be applied to different element electrodes (e.g. 48A and 48B), the liquid droplet 52 may be moved in the lateral plane between the two substrates.

FIG. 4A shows a circuit representation of the electrical load 70A between the element electrode 48 and the reference electrode 58 in the case when a liquid droplet 52 is present. The liquid droplet 52 can usually be modeled as a resistor and capacitor in parallel. Typically, the resistance of the droplet will be relatively low (e.g. if the droplet contains ions) and the capacitance of the droplet will be relatively high (e.g. because the relative permittivity of polar liquids is relatively high, e.g. ~80 if the liquid droplet is aqueous). In many situations the droplet resistance is relatively small, such that at the frequencies of interest for electrowetting, the liquid droplet 52 may function effectively as an electrical short circuit. The hydrophobic coatings 64 and 68 have electrical characteristics that may be modelled as capacitors, and the insulator 62 may also be modelled as a capacitor. The overall impedance between the element electrode 48 and the reference electrode 58 may be approximated by a capacitor whose value is typically dominated by the contribution of the insulator 62 and hydrophobic coatings 64 and 68 contributions, and which for typical layer thicknesses and materials may be on the order of a pico-Farad in value.

FIG. 4B shows a circuit representation of the electrical load 70B between the element electrode 48 and the reference electrode 58 in the case when no liquid droplet is present. In this case the liquid droplet components are replaced by a capacitor representing the capacitance of the non-polar fluid 60 which occupies the space between the top and lower substrates. In this case the overall impedance between the element electrode 48 and the reference electrode 58 may be approximated by a capacitor whose value is dominated by the capacitance of the non-polar fluid and which is typically small, on the order of femto-Farads.

For the purposes of driving and sensing the array elements, the electrical load 70A/70B overall functions in effect as a capacitor, whose value depends on whether a liquid droplet 52 is present or not at a given element electrode 48. In the case where a droplet is present, the capacitance is relatively high (typically of order pico-Farads), whereas if there is no liquid droplet present the capacitance is low (typically of order femto-Farads). If a droplet partially covers a given electrode 48 then the capacitance may approximately represent the extent of coverage of the element electrode 48 by the liquid droplet 52.

U.S. Pat. No. 7,163,612 (Sterling et al., issued Jan. 16, 2007) describes how TFT based thin film electronics may be used to control the addressing of voltage pulses to an EWOD array by using circuit arrangements very similar to those employed in active matrix display technologies. The approach of U.S. Pat. No. 7,163,612 may be termed "Active Matrix Electrowetting on Dielectric" (AM-EWOD). There are several advantages in using TFT based thin film electronics to control an EWOD array, namely:

Electronic driver circuits can be integrated onto the lower substrate.
TFT-based thin film electronics are well suited to the AM-EWOD application. They are cheap to produce so that relatively large substrate areas can be produced at relatively low cost.
TFTs fabricated in standard processes can be designed to operate at much higher voltages than transistors fabricated in standard CMOS processes. This is significant since many EWOD technologies require electrowetting voltages in excess of 20V to be applied.

FIG. 5 is a drawing depicting an exemplary arrangement of thin film electronics 46 in the exemplary AM-EWOD device 36 of FIG. 2. The thin film electronics 46 is located upon the lower substrate 44. Each array element 51 of the array of elements 50 contains an array element circuit 72 for controlling the electrode potential of a corresponding element electrode 48. Integrated row driver 74 and column driver 76 circuits are also implemented in thin film electronics 46 to supply control signals to the array element circuit 72. The array element circuit 72 may also contain a sensor capability for detecting the presence or absence of a liquid droplet in the location of the array element. Integrated sensor row addressing 78 and column detection circuits 80 may further be implemented in thin film electronics for the addressing and readout of the sensor circuitry in each array element.

A serial interface 82 may also be provided to process a serial input data stream and facilitate the programming of the required voltages to the element electrodes 48 in the array 50. A voltage supply interface 84 provides the corresponding supply voltages, top substrate drive voltages, and other requisite voltage inputs as further described herein. A number of connecting wires 86 between the lower substrate 44 and external control electronics, power supplies and any other components can be made relatively few, even for large array sizes. Optionally, the serial data input may be partially parallelized. For example, if two data input lines are used the first may supply data for columns 1 to X/2, and the second for columns (1+X/2) to M with minor modifications to the column driver circuits 76. In this way the rate at which data can be programmed to the array is increased, which is a standard technique used in liquid crystal display driving circuitry.

Various methods of controlling an AM-EWOD device to sense droplets and perform desired droplet manipulations have been described. For example, US 2017/0056887 (Hadwen et al., published Mar. 2, 2017) describes the use of capacitance detection to sense dynamic properties of reagents as a way for determining the output of an assay. Such disclosure incorporates an integrated impedance sensor circuit that is incorporated specifically into the array element circuitry of each array element.

Accordingly, attempts have been made to optimize integrated impedance sensing circuitry into the array element structure, and in particular as part of the array element circuitry. FIG. 6 is a drawing depicting an array element including exemplary array element circuitry for an AM-EWOD device that embodies a previous design of Applicant. This basic circuit has three thin film transistors (TFTs T1, T2, and T3) and two capacitors (C1 and C2), and is associated with seven addressing lines. The pixel circuits, here and throughout, are drawn with the following conventions. The boundaries of a pixel are denoted by a dotted line. Row and column addressing lines are shown passing through the pixel in the horizontal and vertical directions respectively. Power supply connections, which could in principle be supplied either in row or column lines, are shown by short horizontal lines (e.g. VCCA in FIG. 6). Connecting wires are shown with a solder dot, and without the dot, crossing lines do not connect. The $R_{drop}$ and $Cr_{drop}$ represent an approximate model of the resistance and capacitance across the gap from the reference (top) electrode TP to the hydrophobic coating on which the droplet may sit, and any other insulating layers incorporated into the device between the element electrode and the reference electrode are represented by the capacitance C1. The values of $R_{drop}$ and $C_{drop}$ will vary based on the presence or absence of a droplet, as described above with respect to FIGS. 4A and 4B. Example AM-EWOD devices having this basic circuit design are described in Applicant's commonly assigned U.S. Pat. No. 8,653,832 (Hadwen et al., issued Feb. 18, 2014) and US 2018/0078934 (Hadwen et al., published Mar. 22, 2018).

The circuit of FIG. 6 generally is operated as follows. To program an array element by writing voltage data to said array element, the voltage to be programmed is loaded onto addressing line SL, and a pulse is applied to the gate line GL appropriate for the row being programmed. This turns on a drive transistor T1, and the circuit node connected to the electrode is charged to the programmed voltage. When GL is taken low, this voltage is preserved, stored on a storage capacitor C1. Typically, C1 is larger than the second or sensor capacitor C2 by at least about an order of magnitude. To perform sensing, in a reset step a reset transistor T2 is turned on by an RST signal, so the gate of a sensor readout transistor T3 charges to VCCA. In conventional configurations, VCCA is a reset potential chosen below the threshold voltage of T3 such that T3 remains off and any previous voltage is cleared. In a sensing step, the RST signal is set low so that the gate of sensor readout transistor T3 is not driven and an addressing line RWS is pulsed. For the duration of the RWS pulse, the electrode potential is perturbed to a higher voltage. The change in voltage achieved is principally a function of the ratio of capacitor C1 to the total capacitance at the electrode, which includes the load associated with whether the droplet is present or absent. The perturbation is coupled through the sensor capacitor C2 to the gate of T3, and transistor T3 is accordingly turned on to an extent determined by the amplitude of the pulse as coupled. A pixel voltage supply VPIX provides a voltage input so as to generate an output current through T3, which again will be dependent upon the voltage coupled to the gate of T3. The resultant current passes through T3 and is sunk down a sensor output column line COL, which may then be sensed by detection circuitry at the bottom of the column (not shown).

The basic array element circuitry of FIG. 6 also can be modified as may be advantageous for certain applications or circumstances. FIG. 7 is a drawing depicting an array element including exemplary array element circuitry for an AM-EWOD device that embodies another previous design of Applicant. Comparable configurations are described in Applicant's commonly assigned US 2017/0076676 (Hadwen, published Mar. 16, 2017). In this implementation, the three transistor/two capacitor sensing circuitry of U.S. Pat. No. 8,653,832 can be combined with a two transistor/one capacitor array element actuation circuit. This implementation thus contains a total of five transistors, three capacitors, and nine addressing lines, with additional actuation circuitry being combined with impedance sensor circuitry as described. Addressing lines control access to an additional dynamic RAM memory circuit comprising the transistor T4 and a memory capacitor C3. The voltage programmed to this capacitor in turn controls whether or not the input signal from the actuation circuit is connected through to the array element electrode depending upon whether the voltage written to C3 is sufficient to turn on T5. The input signal SEL may further be used to isolate the element electrode from the actuation signal when the sensing function is being operated. In other respects, the sensing function may proceed comparably as described with respect to FIG. 6.

In a variation of the above sensing circuitry of FIGS. 6 and 7, the array element does not contain a row select line (the row addressing line named RWS in U.S. Pat. No. 8,653,832) connected to a capacitor C1 (named Cs in U.S. Pat. No. 8,653,832) which is connected between the RWS line and the element electrode in U.S. Pat. No. 8,653,832. In a similar sensing operation, however, the gate of the reset transistor T2 again is turned on by a signal RST, so the gate of a sensor readout transistor T3 likewise charges to VCCA. Again, in conventional configurations the reset potential VCCA is chosen below the threshold voltage of T3 such that T3 remains off and any previous voltage is cleared.

FIG. 8 is a drawing depicting an array element including exemplary array element circuitry for an AM-EWOD device that embodies another previous design of Applicant. Comparable configurations are described in Applicant's commonly assigned U.S. Pat. No. 8,173,000 (Hadwen et al., issued May 8, 2012). In this implementation, the three transistor/two capacitor impedance sensor circuitry of U.S. Pat. No. 8,653,832 can be combined with an actuation circuit and memory function incorporating an SRAM cell. The memory function includes an n-type switch transistor T4, a p-type switch transistor T5, a first inverter 11, and a second inverter 12. This implementation further includes an inversion circuit including two analogue switches S1 and S2. The capacitances Ch and Cl refer to capacitances of the device layers including the hydrophobic coatings and insulator layers. As described in U.S. Pat. No. 8,173,000, the memory function is written by applying a voltage pulse so as to turn on one of the switch transistors T4 or T5. The input voltage thus written is supplied to the inversion circuit. The operation of the inversion circuit provides an inverted memory node signal that can be obtained from connection to the node between the two inverters of the SRAM cell. In other respects, the sensing function may proceed comparably as described with respect to FIGS. 6 and 7.

Accurate droplet sensing has been a significant subject of development in the field of AM-EWOD devices. For example, F. Azam Shaik et al, 2017, J. Micromech Microeng. 27 054001 (Shaik), is a recent paper by Tokyo university describing an AM-EWOD device with a one-transistor/one-capacitor (1T/1C) array element circuit. The article describes sensing droplets by measuring the mutual capacitance between column lines by pulsing a source line with a 1 Vp-p AC voltage, while the current output from the adjacent source line is measured. The article, therefore, describes a sensing scheme that employs sensing the potential between electrodes by sensing the capacitance between different column lines, referred to in the art as mutual capacitance sensing. Although providing an experimental basis for such mutual capacitance sensing, the actual system is impractical for real-word device applications. The measurement is done entirely by external sensing equipment, and there is no integrated sensing or other integrated column circuitry of any kind. The experimental usage of such external components is impractical for large arrays since an external connection is needed to each column of the array. Mutual capacitance sensing has not been adequately integrated into impedance sensor circuitry that is specifically integrated as part of the array element circuitry.

Even with the advantages of TFT based AM-EWOD devices, analytical challenges remain. Although such integrated impedance sensing circuitry provides effective sensing, the size of the array element circuitry must be enlarged. In the Shaik device employed for academic study of capacitance-based measurements, the array element circuitry has a 1T/1C configuration, as the entire sensing and measuring apparatus is provided externally from the EWOD device array. As referenced above, however, external sensing is not a practical solution in most cases. In the example of integrated sensing circuitry of FIGS. 6 and 7, each array element has a larger 3T/2C configuration, which further may be combined with additional elements of a desired actuation circuitry as illustrated in FIG. 8. Accordingly, improved circuit operation is desired to improve sensing accuracy for various situations while maintaining integrated sensing circuitry in a compact arrangement.

SUMMARY OF INVENTION

The present invention provides an enhanced sensing circuitry that is integrated into array element circuitry of an AM-EWOD device array element, which works in a mutual capacitance mode by perturbing the potential of an element electrode in a first array element (the "perturbing array element electrode") and measuring the response output at an element electrode of a second neighboring array element (the "sensing array element electrode").

Known configurations of droplet sensing with integrated array element circuitry generally work by either (1) measuring the electrical (voltage) perturbation of the electrode of the array element being sensed when a stimulus is applied to the same array element electrode (referred to as a self-capacitance sensing mode), or (2) measuring the electrical (voltage) perturbation of the array element electrode of the array element being sensed when a stimulus is applied to the top or reference electrode. Both of these conventional arrangements have difficulty detecting when two droplets are merging or have failed to merge. The sensing of the merging of droplets can be of critical importance in certain reaction protocols, as improper droplet merging or failure to merge can undermine results, and thus such circumstances should be ascertainable by the impedance sensing circuitry of the array elements.

In accordance with embodiments of the present invention, the integrated impedance sensing circuitry of the array elements is operated in a mutual capacitance mode, whereby: (1) a perturbing array element has an element electrode that is perturbed by a voltage pulse $\Delta V$, and (2), the perturbation results in a coupling through the fluid in the device channel gap to a neighboring sensing array element electrode. The extent of the coupling is a function of the size, position and composition of any liquid droplets in the channel gap. The absence of a liquid droplet, i.e., the presence of only of the non-polar fluid (oil) at the array elements being sensed, results in only a small coupling, whereas the presence of a polar liquid droplet results in a relatively large coupling. The perturbation at the sensing array element electrode is thus sensed using sensing circuitry that is integrated into the array element circuitry, which may be measured from an output line.

Unlike other known arrangements, the mutual capacitance operation of the integrated sensing circuitry of the present invention is capable of detecting whether two droplets have merged, based on whether there is a continuum of polar liquid between the perturbing array element electrode and the sensing array element electrode. Embodiments of the present invention typically exploit integrated impedance sensor circuit configurations, comparable to those of FIGS. 6-8, potentially with or without minor topological modifications, with perturbing and sensing to provide a mutual capacitance mode of operation that is particularly suitable for sensing merging states of liquid droplets. In exemplary embodiments, the top substrate assembly that defines the channel gap does not have a top or reference electrode, and thus an in-plane electrode arrangement may be employed.

An aspect of the invention, therefore, is a method of operating an active matrix electro-wetting on dielectric (AM-EWOD) device that provides for enhanced mutual capacitance sensing using integrated impedance sensing circuitry. In exemplary embodiments, the AM-EWOD device includes a plurality of array elements arranged in an array of rows and columns, each of the array elements including array element circuitry and an array element electrode. The array element circuitry of each array element includes actuation circuitry configured to apply actuation voltages to the array element electrode for actuating the array element, and impedance sensor circuitry integrated into the array element circuitry and configured to sense impedance at the array element electrode, the impedance sensor circuitry comprising a sensor capacitor and a sensor readout transistor that outputs an output current for sensing. The method of operating includes the steps of: perturbing a voltage applied to the array element electrode of a first array element; coupling the voltage perturbation to the array element electrode of a second array element different from the first array element; and measuring the output current from the sensor readout transistor of the second array element for sensing in response to the voltage perturbation. The method according to any of the embodiments may be performed by an AM-EWOD control system executing program code stored on a non-transitory computer readable medium.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto. Features that are described and/or illustrated with respect to one embodiment may be used in the same way or in a similar way in one or more other embodiments and/or in combination with or instead of the features of the other embodiments.

BRIEF DESCRIPTION OF DRAWINGS

FIG. 5 is a drawing depicting an exemplary arrangement of thin film electronics in the exemplary AM-EWOD device of FIG. 2.

FIG. 17 is a drawing depicting an exemplary element array including a plurality of array elements arranged in rows and columns operated using the circuitry of FIG. 16.

FIG. 18 is a drawing depicting an alternative timing diagram that illustrates another exemplary operation of the embodiment of FIG. 9.

FIG. 19 is a drawing depicting the element array as operated in accordance with the timing diagram of FIG. 18.

FIG. 26 is a drawing depicting a timing diagram illustrating timing signal pulses for exemplary operation in accordance with embodiments of the present invention.

DESCRIPTION OF EMBODIMENTS

Figure 1:
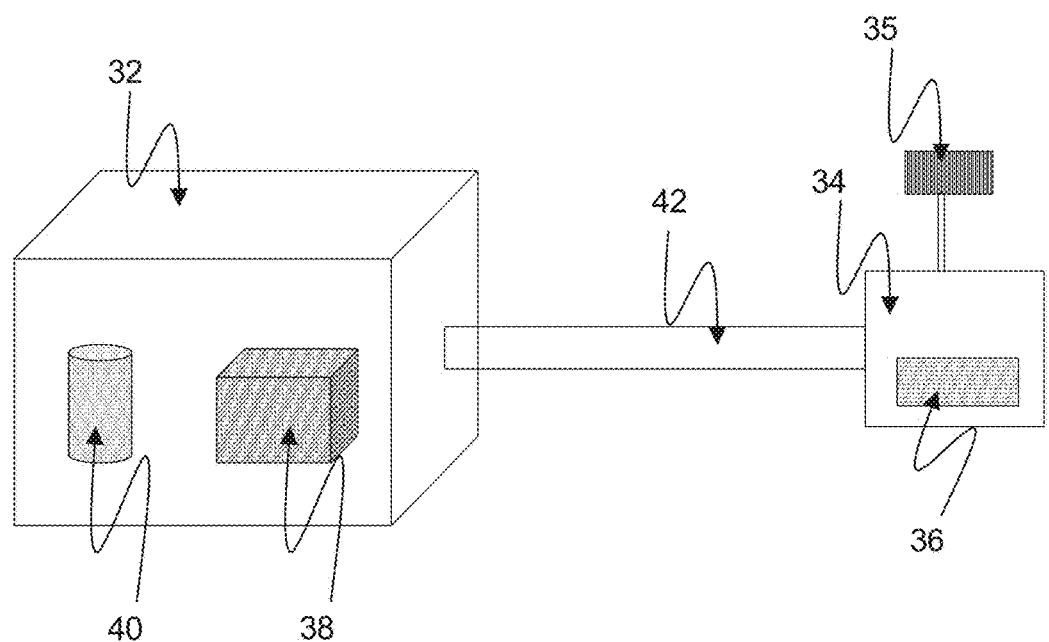
FIG. 1 is a drawing depicting an exemplary EWOD based microfluidic system.
Figure 2:
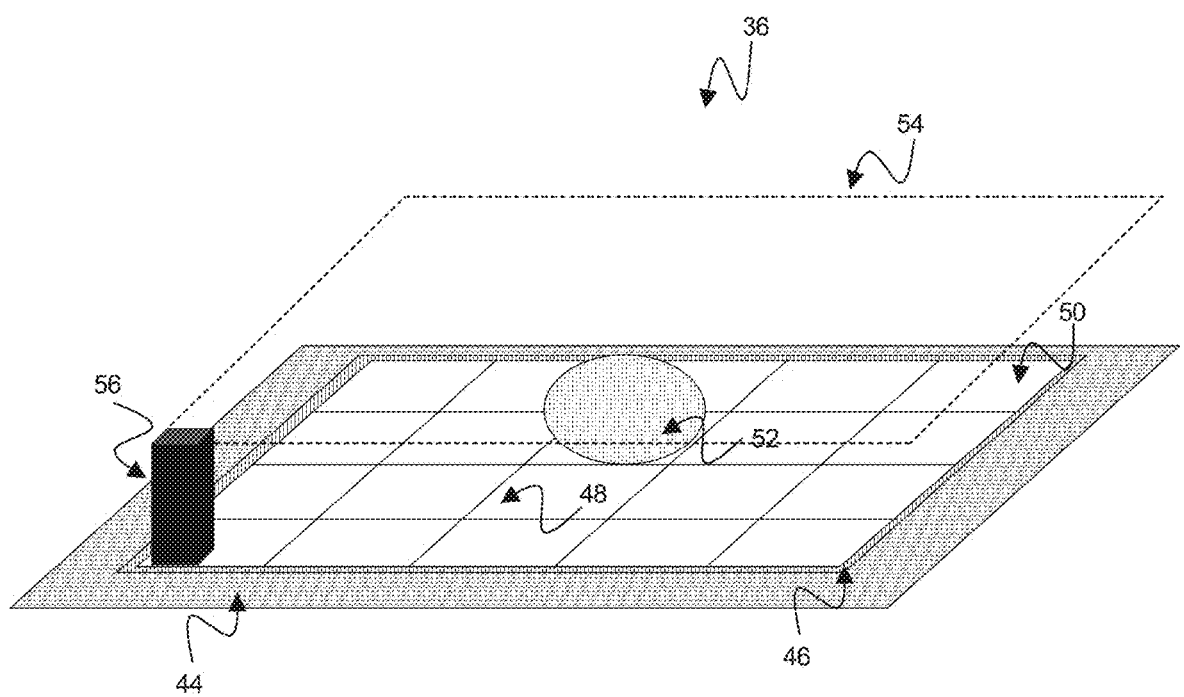
FIG. 2 is a drawing depicting an exemplary AM-EWOD device in a perspective view.
Figure 3:
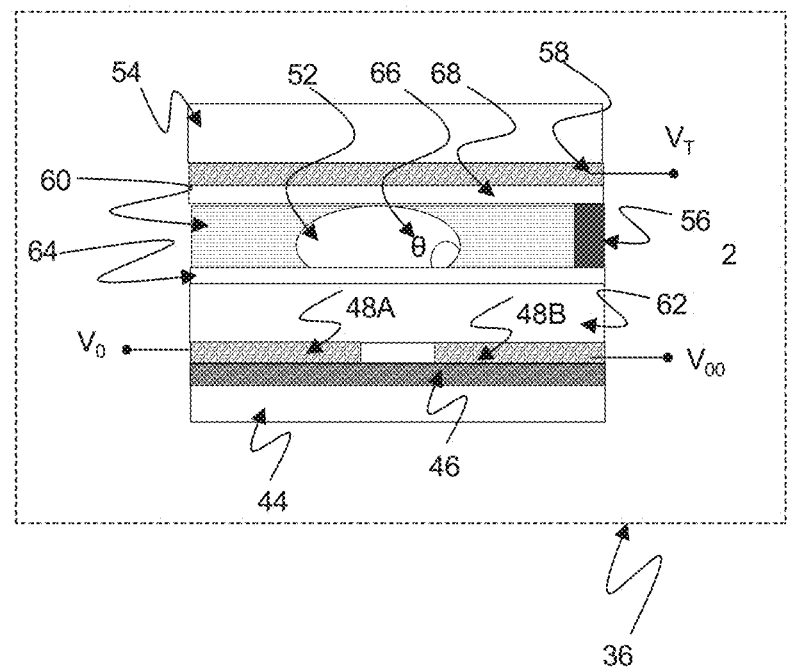
FIG. 3 is a drawing depicting a cross section through some of the array elements of the exemplary AM-EWOD device of FIG. 2.

Embodiments of the present invention will now be described with reference to the drawings, wherein like reference numerals are used to refer to like elements throughout. It will be understood that the figures are not necessarily to scale.

The present invention pertains to enhanced configurations of integrated array element circuitry in AM-EWOD devices, which realize improved sensitivity of the impedance sensing circuitry as integrated within the array elements. The sensing circuitry is improved particularly for sensing a merging state of liquid droplet in the area of the device array being sensed. To accomplish such enhanced sensitivity, the present invention provides for operation of the integrated array element circuitry in a mutual capacitance mode by perturbing the potential of an element electrode in a first array element (the "perturbing array element electrode") and measuring the response output at an element electrode of a second neighboring array element (the "sensing array element electrode").

The integrated sensing circuitry of the array elements is operated in a mutual capacitance mode, whereby: (1) a perturbing array element has an electrode that is perturbed by a voltage pulse ΔV, and (2), the perturbation results in a coupling through the fluid in the device channel gap to a neighboring sensing array element electrode. The extent of the coupling is a function of the size, position, and composition of any liquid droplets in the channel gap. The absence of a polar liquid droplet, i.e., the presence of only of the non-polar fluid (oil) at the array elements being sensed, results in only a small coupling, whereas the presence of a polar liquid droplet results in a relatively large coupling. The perturbation measured at the sensing array element electrode is thus sensed using sensing circuitry that is integrated into the array element circuitry. In exemplary embodiments, the top substrate assembly that defines the channel gap does not have a top or reference electrode, and thus an in-plane electrode arrangement may be employed.

An aspect of the invention, therefore, is a method of operating an active matrix electro-wetting on dielectric (AM-EWOD) device that provides for enhanced mutual capacitance sensing using integrated impedance sensing circuitry. In exemplary embodiments, the AM-EWOD device includes a plurality of array elements arranged in an array of rows and columns, each of the array elements including array element circuitry and an array element electrode. The array element circuitry of each array element includes actuation circuitry configured to apply actuation voltages to the array element electrode for actuating the array element, and impedance sensor circuitry integrated into the array element circuitry and configured to sense impedance at the array element electrode, the impedance sensor circuitry comprising a sensor capacitor and a sensor readout transistor that outputs an output current for sensing. The method of operating includes the steps of: perturbing a voltage applied to the array element electrode of a first array element; coupling the voltage perturbation to the array element electrode of a second array element different from the first array element; and measuring the output current from the sensor readout transistor of the second array element for sensing in response to the voltage perturbation. The method according to any of the embodiments may be performed by an AM-EWOD control system executing program code stored on a non-transitory computer readable medium.

Figure 6:
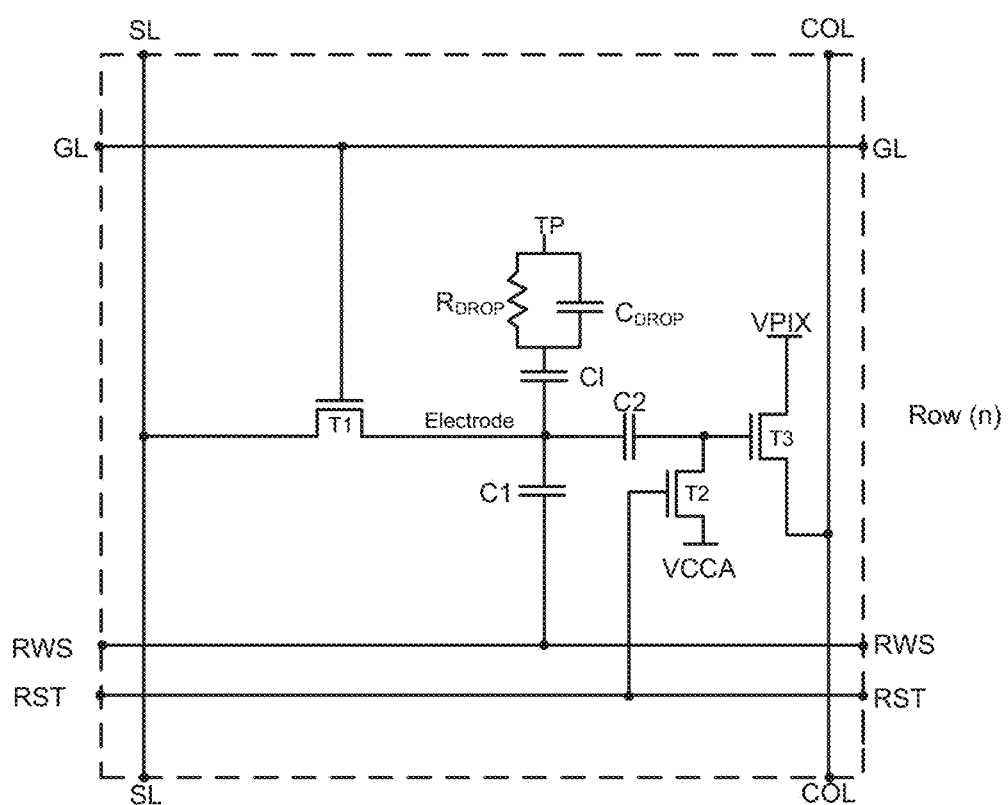
FIG. 6 is a drawing depicting an array element including exemplary array element circuitry for an AM-EWOD device that embodies a previous design of Applicant.
Figure 9:
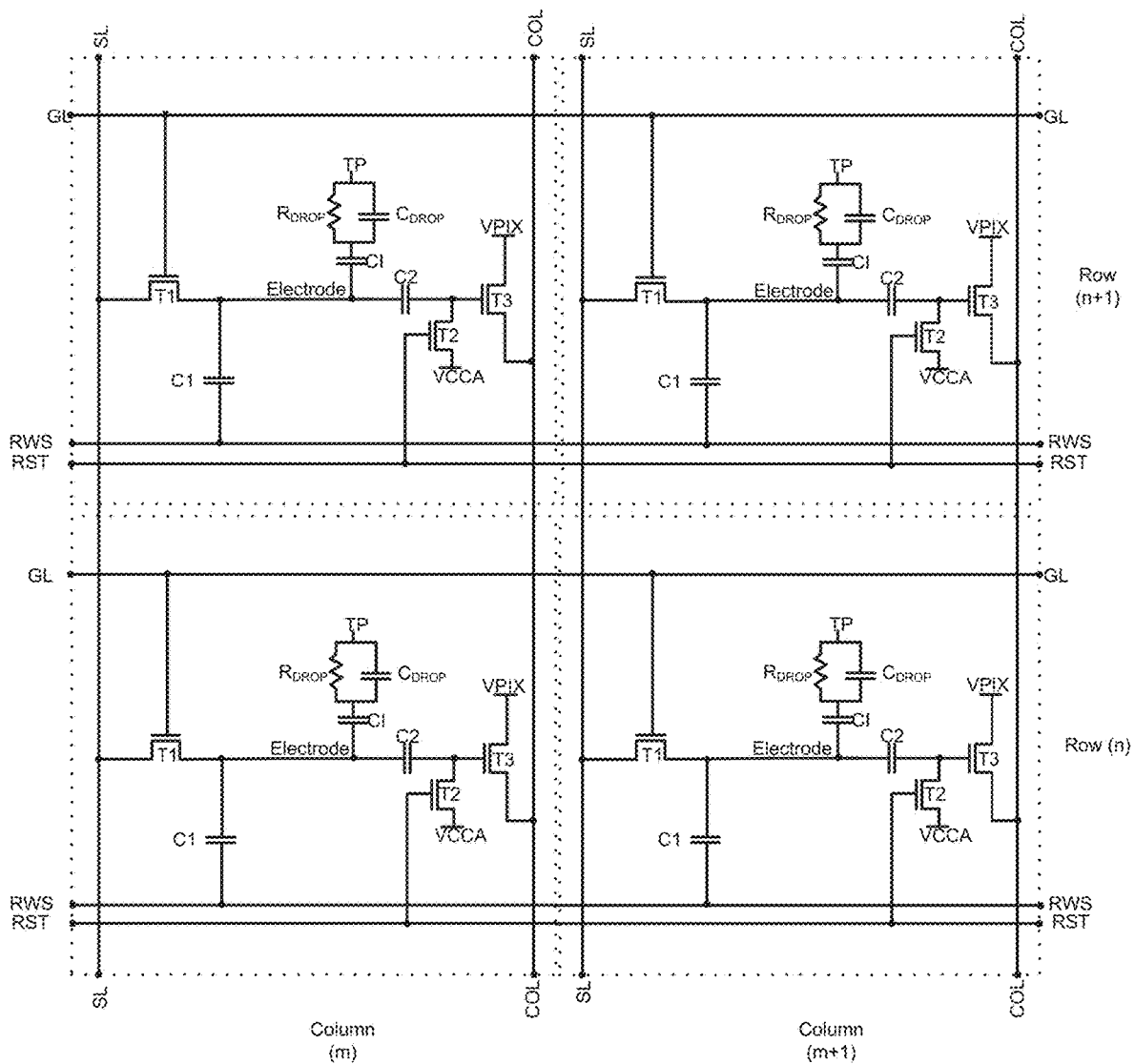
FIG. 9 is a drawing depicting a plurality of array elements including exemplary array element circuitry based on the array element circuitry of FIG. 6.
Figure 10:
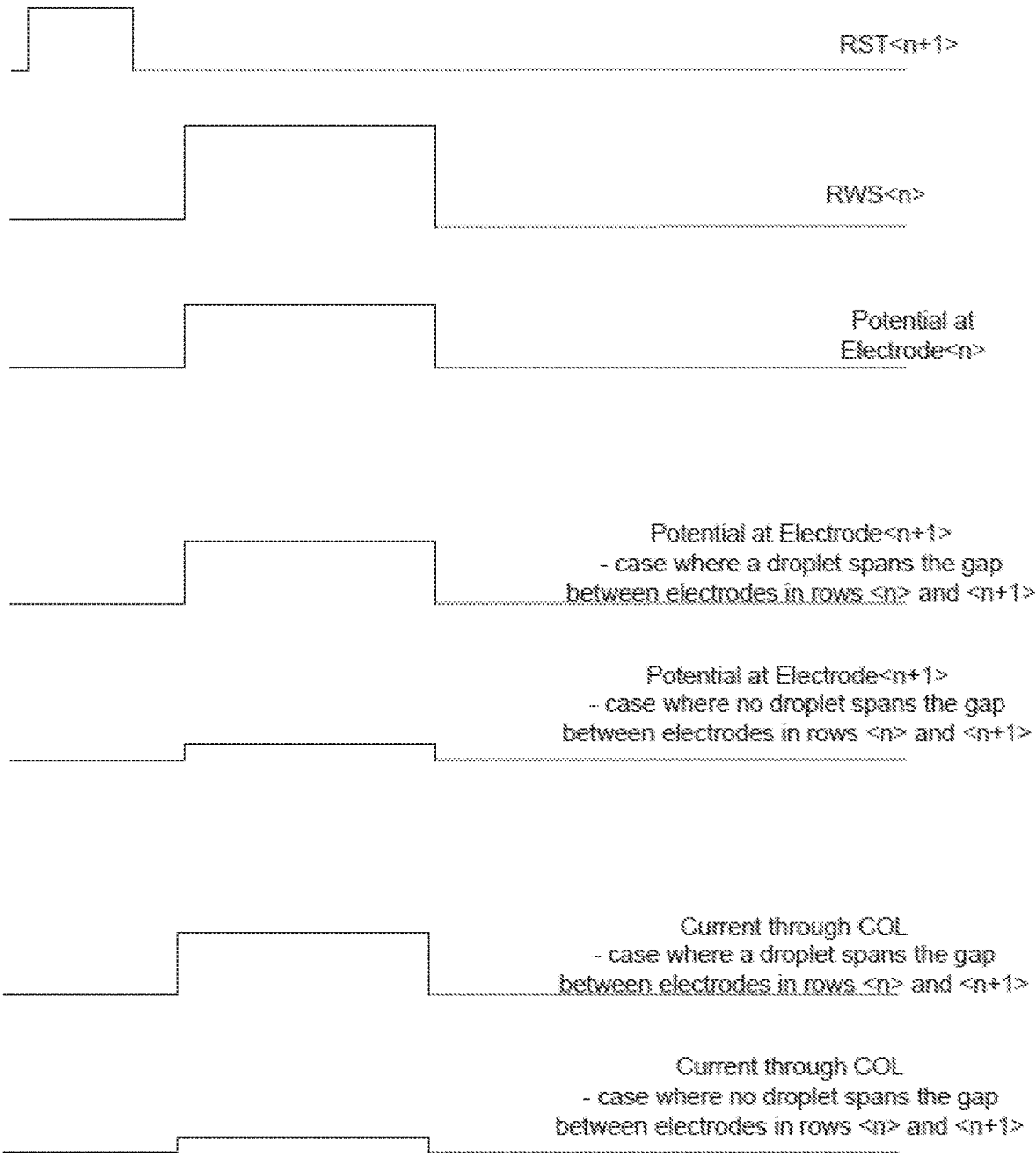
FIG. 10 is a drawing depicting a timing diagram that illustrates an exemplary operation of the embodiment of FIG. 9 in a mutual capacitance mode.

As an example of such embodiments, FIG. 9 is a drawing depicting a plurality of array elements including exemplary array element circuitry based on the array element circuitry of FIG. 6. FIG. 10 is a timing diagram that illustrates the operation of the embodiment of FIG. 9. FIG. 9 depicts a 2×2 portion of an element array arranged in a Column(m) and Column(m+1) positioned in adjacent rows, respectively Row(n) and Row(n+1). It will be appreciated that principles of this and the other embodiments may be expanded as warranted to any suitable element array size.

Figure 4A:
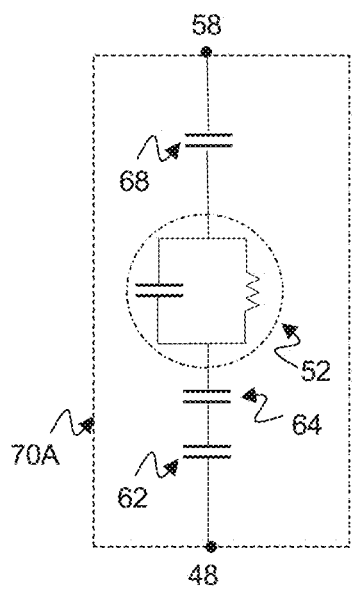
FIG. 4A is a drawing depicting a circuit representation of the electrical load presented at the element electrode when a liquid droplet is present.
Figure 4B:
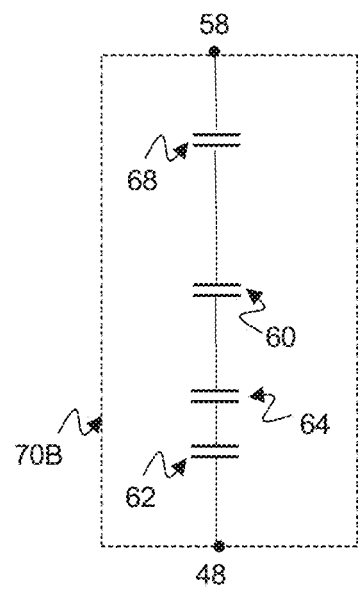
FIG. 4B is a drawing depicting a circuit representation of the electrical load presented at the element electrode when no liquid droplet is present.

Programming and actuation may proceed comparably as described with respect to FIG. 6. Similarly, as described with respect to FIG. 6, this basic circuit for impedance sensing has three thin film transistors (TFTs T1, T2, and T3), with a memory capacitor C1 and a sensor capacitor C2 (the 3T/2C arrangement). The $R_{drop}$ and $C_{drop}$ represent the resistance and capacitance across the device from the reference (top) electrode TP to the hydrophobic coating on which the droplet may sit. The capacitance of lower device components, including the hydrophobic coating and any other insulator layers incorporated into the device, are represented by the capacitance Cl. The values of $R_{drop}$ and $C_{drop}$ that model the electrical impedance of the gap will vary based on the presence or absence of a polar liquid droplet, as described above with respect to FIGS. 4A and 4B.

The array elements are operated to implement a mutual capacitance mode of sensing, whereby a voltage perturbation is supplied to one element electrode in the array and detected at another element electrode in a neighboring array element in the array. In this particular embodiment, the perturbing array element is in Row(n) and the sensing array element is in Row(n+1). Referring to the timing diagram of FIG. 10, the sensing operation proceeds as follows. A reset signal in Row(n+1), RST(n+1), is taken high, and the reset transistor T2 is switched on for array elements in the corresponding Row(n+1). As a result, a gate of the sensor readout transistor T3 is reset to the initialization potential VCCA, with the initialization voltage being selected such that T3 is turned off for sensing. Then a row select signal for Row(n), RWS(n), is pulsed high. Accordingly, the potential at the element electrode of the array element of Row(n) is boosted high via the capacitor C1 in said Row(n) as shown in FIG. 10.

The perturbation of the array element electrode in Row(n) couples to the array element electrode in Row(n+1), to an extent that depends on the presence and extent of coverage of a polar liquid droplet over the array elements in Row(n) and Row(n+1). The voltage perturbation in turn couples through the sensor capacitor C2 to the gate of the sensor readout transistor T3, from which an output current is read down the COL line. The extent of the coupling is shown in the timing diagram of FIG. 10 in that the voltage pulse coupled to the array element electrode in Row(n+1) is greater when a liquid droplet spans the gap between array element electrodes of Row(n) and Row(n+1), as compared to when no liquid droplet spans the gap between array element electrodes of Row(n) and Row(n+1). This difference further is illustrated in the timing diagram in that the measured output current down the output column line COL is greater when a liquid droplet spans the gap between array element electrodes of Row(n) and Row(n+1), as compared to when no liquid droplet spans the gap between array element electrodes of Row(n) and Row(n+1). In this manner, the expanse of liquid droplet coverage ultimately may be determined by measuring of the output COL line from the sensor readout transistor associated with the sensing array element.

Figure 11:
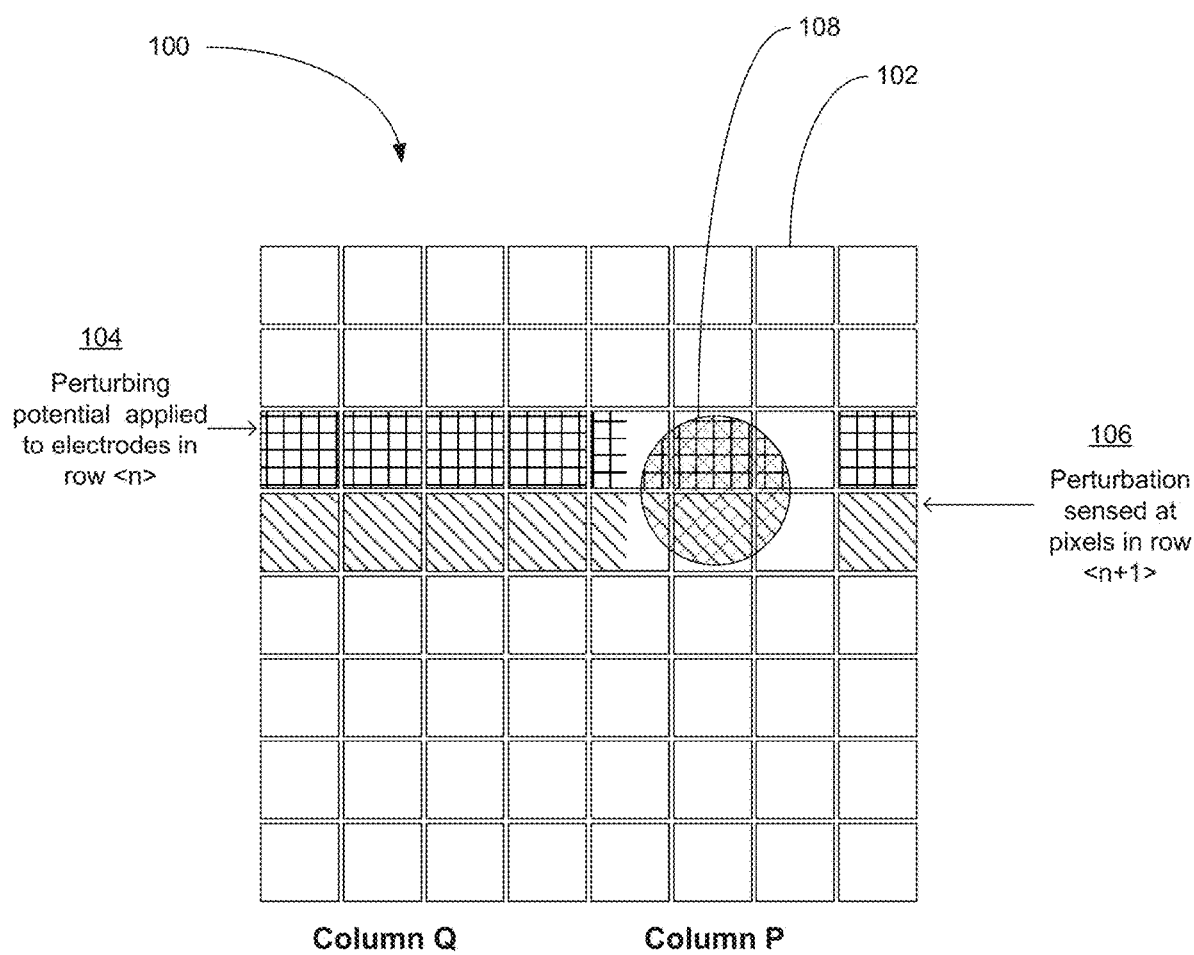
FIG. 11 is a drawing depicting an exemplary element array including a plurality of array elements arranged in rows and columns with a liquid droplet spanning certain array elements in different rows.
Figure 12A:
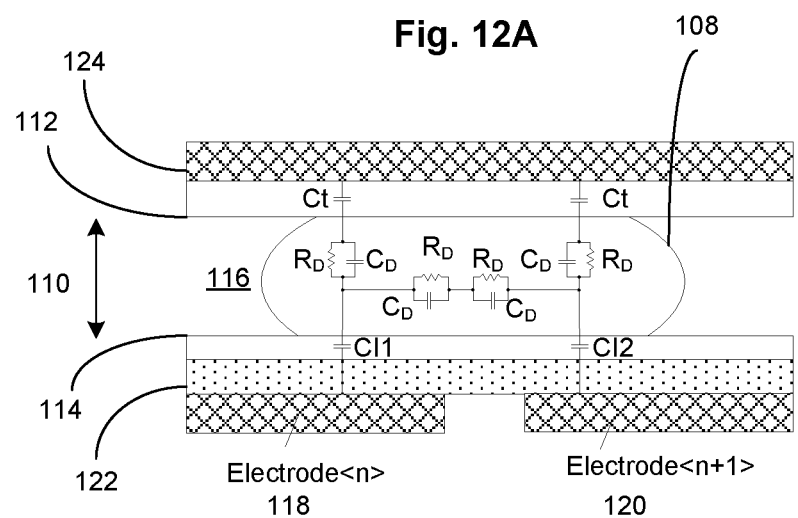
FIGS. 12A and 12B are drawings depicting corresponding cross-sectional views of array elements in adjacent rows, in particular when a liquid droplet is present comparably as shown in Column P of FIG. 11 (FIG. 12A), and when a liquid droplet is not present comparably as shown in Column Q of FIG. 11 (FIG. 12B).
Figure 12B:
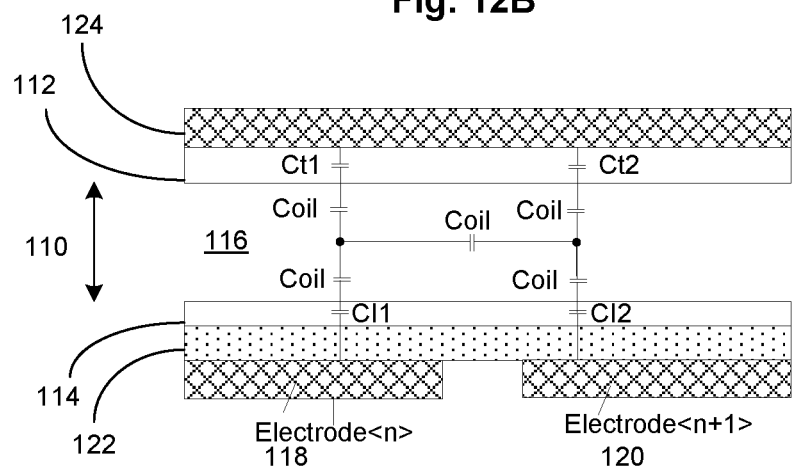

This difference is illustrated further with reference to FIGS. 11 and 12A/12B. FIG. 11 is a drawing depicting an exemplary element array 100 including a plurality of array elements 102 arranged in rows and columns (again, any suitable array size may be employed). In this example, a perturbing row 104 at which the RWS voltage pulse is applied, Row(n), is illustrated in relation to a sensing row 106 from which the output signal is read down the output COL line, Row(n+1). A liquid droplet 108 further is depicted as spanning array elements in Row(n) 104 and Row(n+1) 106. Additional column indications are designated Column P and Column Q in FIG. 11, whereby Column P includes array elements where the liquid droplet 108 is present and Column Q includes array elements where no liquid droplet is present. FIGS. 12A and 12B illustrate corresponding cross-sectional views of array elements in Row(n) 104 and Row(n+1) 106, in particular when a liquid droplet 108 is present comparably as shown in Column P of FIG. 11 (FIG. 12A), and when a liquid droplet is not present comparably as shown in Column Q of FIG. 11 (FIG. 12B).

Referring to the cross-sectional views of FIGS. 12A and 12B, each array element is configured comparably as described above. A channel gap 110 may be defined by a first hydrophobic coating 112 and a second hydrophobic coating 114, the channel gap being filled with a non-polar fluid or oil 116 into which liquid droplets 108 may be dispensed. Each array element as depicted in these figures includes a respective array element electrode 118 (Electrode(n)) and 120 (Electrode(n+1)) of different rows, which are separated from the second hydrophobic coating by an ion barrier and insulator layer 122. The array element structure further may include a top or reference electrode 124 on an opposite side of the channel gap relative to the first hydrophobic coating 112. The capacitance Ct represents the capacitance of the first hydrophobic coating 112 relative to the top electrode, and the capacitances Cl1 and Cl2 represent the combined capacitances of the second hydrophobic coating 114 and ion barrier and insulator 122 layers relative to each of the first and second array element electrodes 118 and 120 respectively. In FIG. 12A with the liquid droplet 108 present, the $R_D/C_D$ combinations are a representation approximating the electrical properties (resistance and capacitance) associated with the liquid droplet 108 between the electrode layers and through the liquid droplet itself between the neighboring array elements 118 and 120. In FIG. 12B with the liquid droplet not present, the $C_{OIL}$ indications represent the electrical properties of the filler fluid or oil 116, which as a non-polar fluid essentially is only a capacitance, associated with the filler fluid/oil 116 between the electrode layers and through the oil itself between the neighboring array elements 118 and 120. Because the electrical permittivity of the oil is typically in the range of 1-10, or typically around 2, the representative value of $C_{OIL}$ is typically 1-2 orders of magnitude smaller than $C_D$, the electrical permittivity of the droplet (if aqueous based) being typically around 80.

As illustrated in FIG. 12A, the liquid droplet 108 covers part of Electrode(n) 118 and Electrode(n+1) 120, corresponding to Column P of FIG. 11. When the liquid droplet 108 is relatively conductive as is common (typically if salt concentration>1 mM), there is an impedance between Electrode(n) and Electrode(n+1) that is approximately proportional to the series combination of capacitor Cl1 and Cl2, insofar as a polar liquid droplet acts essentially as a short circuit. In such circumstances, Electrode(n) 118 is strongly capacitively coupled to Electrode(n+1) 120, with a typical coupling capacitance being on the order of a few pF. Accordingly, a perturbation voltage applied at Electrode(n) 118 is coupled to Electrode(n+1) 120 resulting in the COL output shown in the timing diagram of FIG. 10 indicating when a droplet is present that spans a gap between Electrode(n) 118 and Electrode(n+1) 120.

In contrast, as illustrated in FIG. 12B no droplet is present that spans any of the array element electrodes 118 and 120, corresponding to Column Q of FIG. 11. Coupling from Electrode(n) 118 to Electrode(n+1) 120 is therefore only via the filler fluid or oil 116 in the channel gap 110. Because the oil is non-polar the electrical properties are dominated by the oil, as represented by the network of capacitances $C_{OIL}$ in FIG. 12B. Based on the typical physical dimensions of the AM-EWOD device (e.g., the typical separation between the adjacent electrodes 118 and 120 is about 3-10 μm; the typical cell gap height is in the range 30-250 μm), the total coupling capacitance is much smaller than when a polar liquid droplet is present, typical on the order of 10 s fF. Accordingly, a perturbation voltage applied at Electrode(n) 118 is only minutely coupled to Electrode(n+1) 120 resulting in the COL output shown in the timing diagram of FIG. 10 indicating when a droplet is not present that spans a gap between Electrode(n) 118 and Electrode(n+1) 120.

In a typical element array sensing implementation, the whole array will be sensed one row at a time, by perturbing array elements in a selected Row(n) and sensing array elements in a neighboring Row(n+1) by measuring the COL output from the sensor readout transistor of the sensing array element. The entire array can be sensed by sequentially cycling the selected Row(n) and Row(n+1) on a row-by-row basis to map the whole array. It will equally be appreciated that Row(n+1) could be perturbed and Row(n) sensed, i.e., the precise positioning of the row being perturbed and the row being sensed may be interchanged.

Figure 13A:
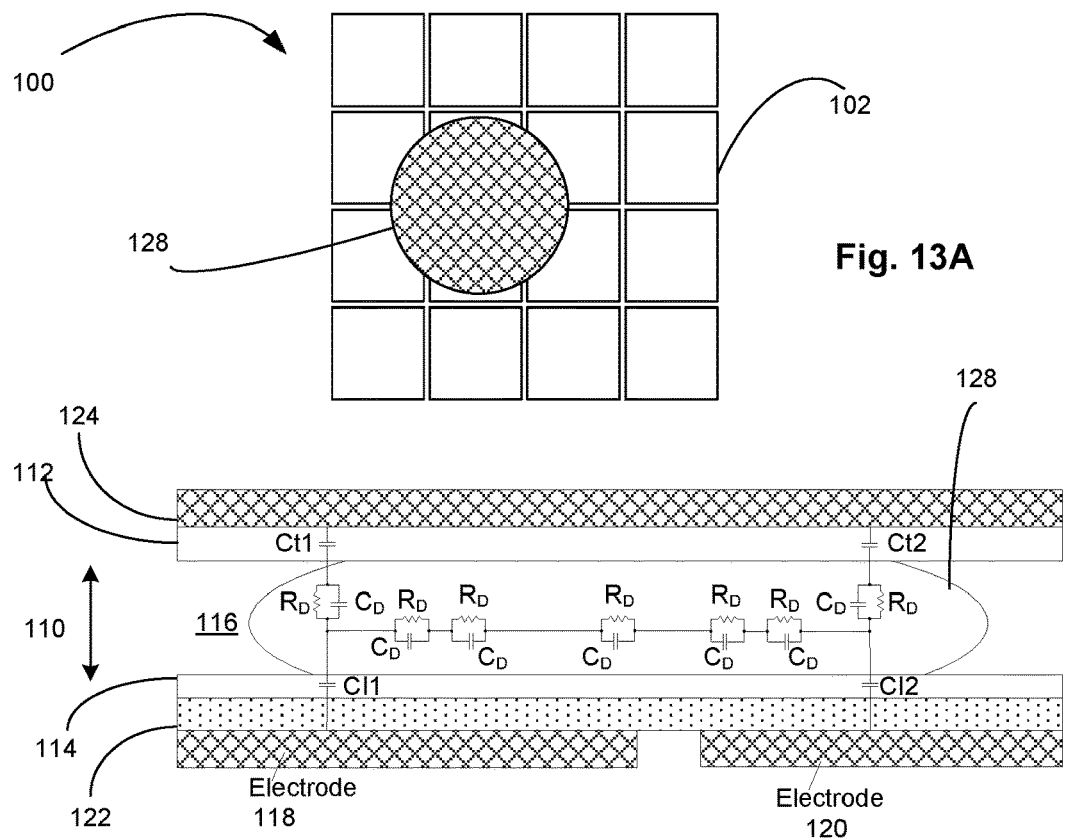
FIGS. 13A and 13B are drawings depicting operation of the embodiment of FIGS. 9 and 10 illustrating the determination of a merged state of a droplet.
Figure 13B:
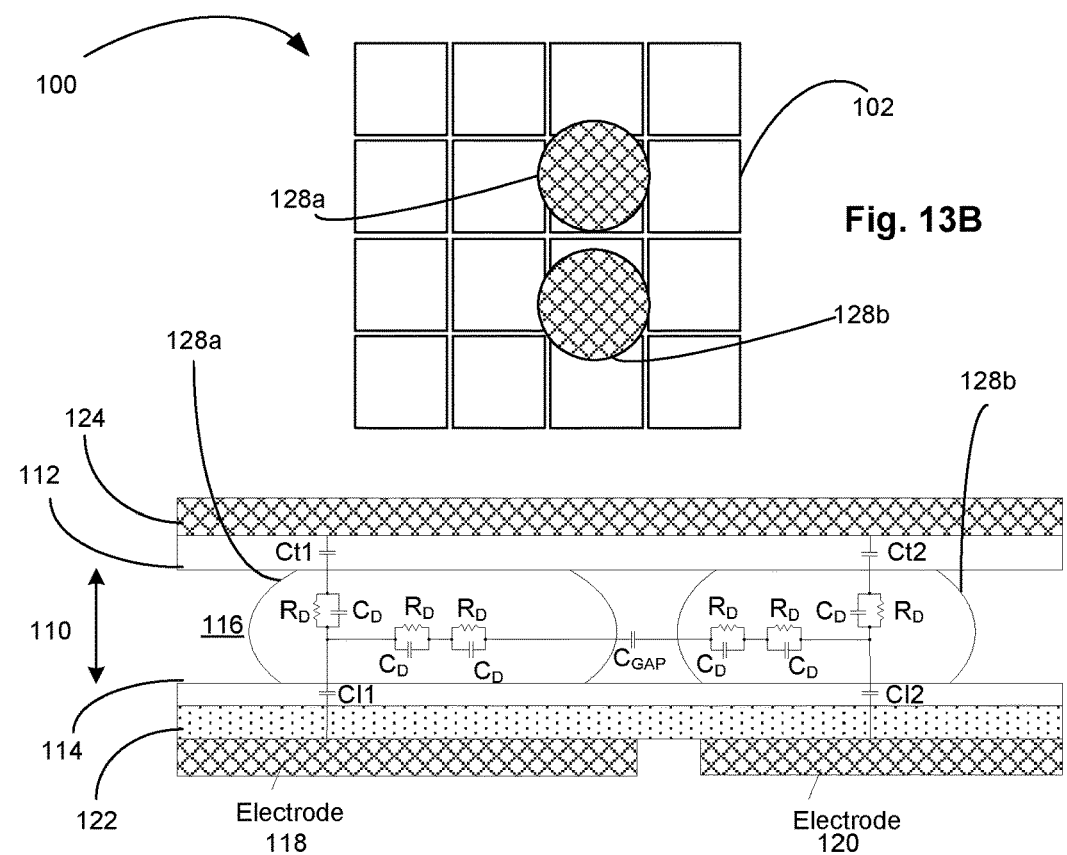

As an example of advantageous operation of the mutual capacitance mode described above, such operation is particularly suitable for sensing a merged state of a liquid droplet, i.e., whether or not two separate liquid droplets have merged. In accordance with such application, FIGS. 13A and 13B are drawings depicting operation of the embodiment of FIGS. 9 and 10 illustrating the determination of a merged state of a droplet. In such example, two droplets are brought into near proximity so that they may or may not merge. FIG. 13A shows the arrangement in which two droplets have successfully merged into a single merged droplet 128, both from a plan view (top) and side view (bottom). In such case, the continuum of polar liquid through the merged droplet 128 results in a high degree of coupling between the two element electrodes 118 and 120, with the coupling impedance being approximately that comprising the series combination of Cl1 and Cl2 much like the single droplet 108 as depicted in FIG. 12A (in other words, the merged droplet 128 essentially may be a larger droplet but is still a single droplet).

In contrast, FIG. 13B illustrates the circumstance in which two singular droplets 128a and 128b fail to merge, both in a plan view (top) and side view (bottom). In this circumstance, a gap between the droplets, which essentially includes only the non-polar fluid (oil), is electrically represented by a capacitance $C_{GAP}$. When the droplets 128a and 128b fail to merge, there is a substantial difference in the total impedance between the two element electrodes 118 and 120 based on $C_{GAP}$, even when the gap is small (for example, on the order of a micrometer or less), as a conducting continuity is interrupted by the oil (nonpolar) gap between the two non-merged droplets. The total impedance, therefore, is based on the series combination of Cl1 and Cl2 further in combination with Ct1 and Ct2 in series, such combination being in parallel with $C_{GAP}$. Thus, the gap capacitance due to a nonpolar gap between the non-merged droplets of only a micron or so is significant and detectable by a measured difference in the output down the COL line associated with the pertinent sensing array element. This arrangement is therefore very well suited to detecting whether droplets have merged or not.

The capability of the system to detect droplet merging is a significant advantage over conventional sensing operations. Droplets may fail to merge for a number of reasons, including for example the effect of the gap between the electrodes, particularly when the gap between the separate droplets aligns with the gap between the element electrodes. Droplets may also fail to merge due to timing errors, such as errors that may occur when actuation patterns defined to effect droplet merging are applied for too short a time. Another reason for merging failure may be non-optimized surfactant balance, which may result in the surface energy of the droplets being too low so that droplets touch without merging or "bounce" off each other. Because the system operation has the capability to detect failures in droplet merging, the control software may adjust operation as warranted to perform automated corrective action, including for example repeating the merge operation, and/or the system otherwise may report an error to the user.

Figure 14:
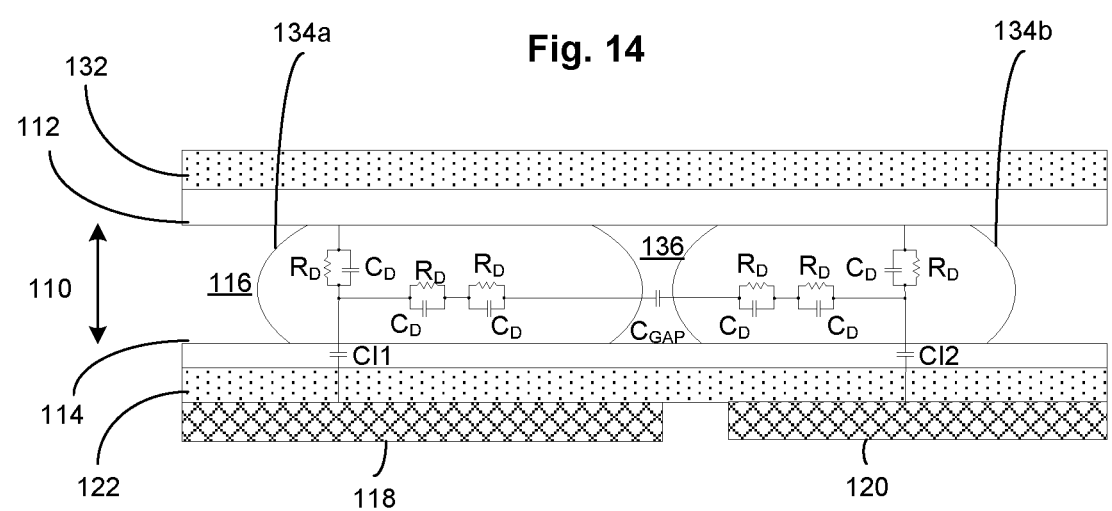
FIG. 14 is a drawing depicting an in-plane electrode structure operated in a mutual capacitance mode in accordance with embodiments of the present invention.

FIG. 14 is a drawing depicting an in-plane electrode structure in accordance with embodiments of the present invention. The array element structure of FIG. 14 is comparable to that illustrated, for example, in FIGS. 12 and 13 except that the top reference electrode is replaced with a non-electrode substrate layer 132, such as for example a glass substrate. The electrodes, therefore, are solely the array element electrode 118 and 120, and thus all the electrodes essentially are in the same plane. With an in-plane electrode structure, actuation and movement of the droplet are achieved by using unactuated array elements to perform the function of the reference electrode, with the electrowetting forces being generated by the potential difference between actuated and unactuated in-plane array element electrodes.

AM-EWOD device construction using an in-plane reference electrode has certain general advantages. By using a top glass substrate without a top or reference electrode, the overall structure is simplified, which simplifies the manufacturing process and reduces cost. Likewise, there is no requirement for a conductive via structure for making electrical contacts to the top reference electrode, again simplifying the manufacturing process and reducing cost. Reliability also may be improved. In operation there is no electric field through the hydrophobic coating of the top substrate. This may be preferable, as the electric field through the hydrophobic coating can compromise efficacy or result in the generation of bubbles in the filler fluid or liquid droplets. On the other hand, a disadvantage is that electrowetting forces may be more difficult to generate precisely with an in-plane configuration, and thus the previous embodiment having a top reference electrode may be more suitable for manipulating very small droplets.

With the respect to sensing, the in-plane configuration may have an advantage in sensing in that the additional capacitance pathways Ct of FIGS. 12 and 13 are eliminated by elimination of the top reference electrode. For example, FIG. 14 shows a circumstance in which two droplets 134a and 134b have failed to merge, being separated by a very small gap 136 that is smaller than an electrode gap between adjacent electrodes (e.g., about 1 μm or less), and having a capacitance of $C_{GAP}$. Because capacitances Ct1 and Ct2 of FIG. 13B are removed from the system, the total capacitance between the two electrodes is the series combination of Cl1, Cl2, and $C_{GAP}$. Accordingly, the total capacitance is even more strongly dependent on $C_{GAP}$ (the smallest of the three capacitance values) as compared to the situation of FIG. 13B with the top electrode present. The in-plane electrode configuration of FIG. 14 is therefore capable of detecting the presence of extremely small distances of gaps 136 between the two droplets 134a and 134b, i.e., smaller than the inter-electrode gap, which may on the order of about 1 um or less.

Figure 15:
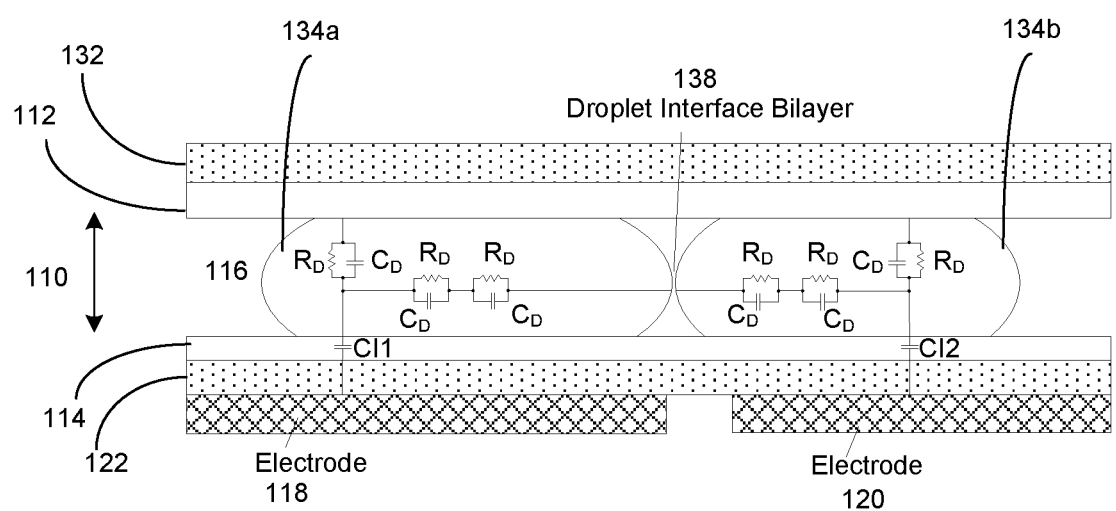
FIG. 15 is a drawing depicting an example of the use of the in-plane electrode configuration of FIG. 14, in which the liquid droplets are in sufficient proximity to form a droplet interface bilayer

FIG. 15 shows a further example of the use of the in-plane electrode configuration of FIG. 14, in which the droplets 134a and 134b are in sufficient proximity to form a droplet interface bilayer 138 in which the two droplets are essentially touching but the droplets still do not merge. The gap distance corresponding to a droplet interface bilayer is on the order of 10 nm or less. In such circumstance, the mutual capacitance mode of operation described above is particularly of value. In this case the two droplets are coalesced to remain touching, but without merging. By appropriate choice of surfactants in the system, a lipid bilayer forms a droplet interface bilayer (DIB) at the interface between the droplets. DIBs have multiple applications in EWOD applications, including for example forming structures for patch-clamp sensing, for example as described in Martel and Cross, Biomicrofluidics, 6, 012813 (2012), or for sequencing DNA when a nanopore is inserted into the DIB, as described for example in GB1721649.0.

Essentially, therefore, a different COL output is achieved with respect to (1) the gap 130 of FIG. 13B which is of a distance on the order of the electrode gap between adjacent element electrodes 118 and 120 (typically 3-100 μm); versus (2) the gap 136 of FIG. 14 which generally is of a distance smaller than the electrode gap between adjacent element electrodes on the order of about 1 μm; versus (3) a DIB formed when the droplets are essentially touching but not merging (e.g., a gap distance of about 10 nm or less). An in-plane electrode arrangement in particular may be suitable for distinguishing among each of such circumstances of varying droplet gap distances. In either the top reference electrode configuration or in-plane electrode configuration, the perturbed and sensed rows may be immediately adjacent (e.g. Row(n) and Row (n+1)), or said rows may be separated by one or more intermediate rows. In implementations arranged to detect whether droplets have merged or whether a DIB has formed, the perturbing and sensing rows generally should be on either side of the gap between the two liquid droplets.

Figure 16:
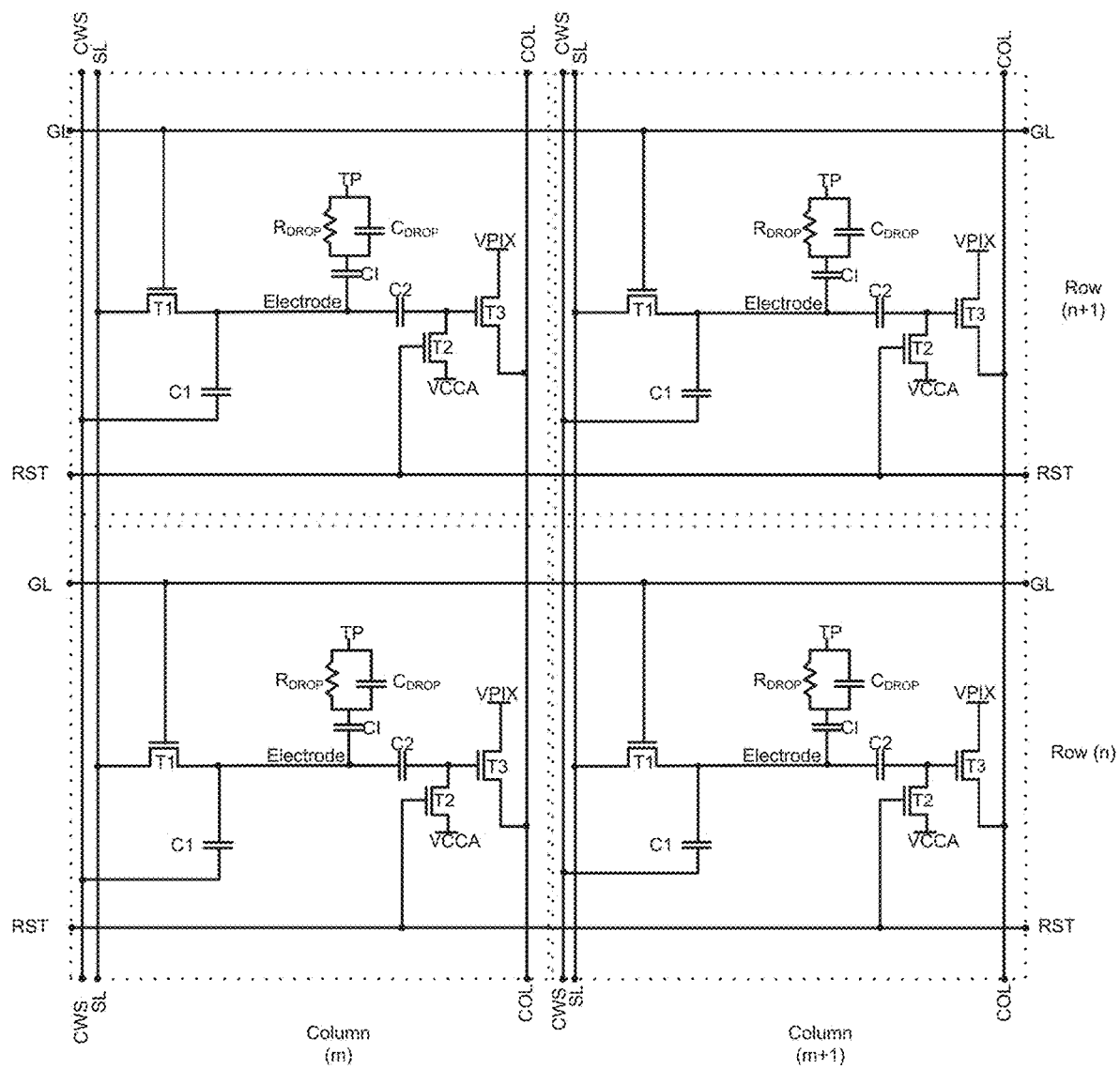
FIG. 16 is a drawing depicting a plurality of array elements including exemplary array element circuitry based on the array element circuitry of FIG. 6, using column base voltage perturbing.

FIG. 16 is a drawing depicting a plurality of array elements including exemplary array element circuitry that is largely comparable to the array element circuitry of FIG. 9, and thus like components are identified with like designations. In this embodiment, the row select line RWS (see FIG. 9) is eliminated, and instead the memory capacitor C1 is connected to a column addressing line CWS to supply the perturbing voltage. This embodiment is operated in accordance with the timing diagram of FIG. 10, except that the CWS line is pulsed replacing the pulse to RWS line. With such configuration, the perturbing voltage pulse is applied to the array element electrode through the memory capacitor C1 on a column basis rather than on a row base.

Accordingly, the operation of the embodiment of FIG. 16 is comparable to that of FIG. 9, except that element electrodes in a column, such as Column(m), are perturbed while electrodes in a row, such as Row(n) are sensed. Such operation is illustrated in FIG. 17, which illustrates the element array 100 with indication of the perturbing column 140 in relation to a sensing row 142, with the liquid droplet 108 spanning array elements in adjacent columns within the sensing row. In this operation, therefore, and array element (m, n) 144 operates in a self-capacitance mode as the COL output is measured off of the same array element being sensed, while the rest of the array elements in the sensing row operate in a mutual capacitance mode as such array elements are in different columns from the perturbing column. An advantage is that in this arrangement the sensing operation is capable of detecting whether droplets have merged when the droplets are in different columns, which is the transverse direction relative to the previous embodiments.

FIG. 18 is a drawing depicting an alternative timing diagram that illustrates another exemplary operation of the embodiment of FIG. 9. Generally, the perturbing voltage pulse to the element electrode of the perturbing array element is supplied from the source line SL rather than through the RWS line, which is coupled to the element electrode through the drive transistor T1. Similarly as in the timing diagram of FIG. 10, the sensing operation begins by applying a reset pulse RST to the gate of the reset transistor T2 of Row(n+1). This again initializes the gate of the sensor readout transistor T3 to the initialization voltage VCCA, which is selected to turn off T3 of the sensing array element. In this embodiment, a row being sensed is selected by operation of the gate line GL(n) for Row(n) to turn on the drive transistor T1 of the selected row, and then the select line SL(m) is pulsed to pulse the selected perturbing array element (n, m) as seen in FIG. 18. In this manner the SL(m) pulse in turn is coupled through the drive transistor T1 to the element electrode of the perturbing array element.

Sensing then proceeds similarly as shown in the timing diagram of FIG. 10. As seen in FIG. 18, the perturbation of the array element electrode in Row(n) couples to the array element electrode in Row(n+1), to an extent that depends on the presence and extent of coverage of a polar liquid droplet over the array elements in Row(n) and Row(n+1). The voltage perturbation in turn couples through the sensor capacitor C2 to the gate of the sensor readout transistor T3, from which an output current is read down the COL line. The extent of the coupling is shown in the timing diagram of FIG. 18 in that the voltage pulse coupled to the array element electrode in Row(n+1) is greater when a liquid droplet spans the gap between array element electrodes of Row(n) and Row(n+1), as compared to when no liquid droplet spans the gap between array element electrodes of Row(n) and Row (n+1). This difference further is illustrated in the timing diagram of FIG. 18 in that the measured output current down the output column line COL is greater when a liquid droplet spans the gap between array element electrodes of Row(n) and Row(n+1), as compared to when no liquid droplet spans the gap between array element electrodes of Row(n) and Row(n+1). In this manner, the expanse of liquid droplet coverage ultimately may be determined by measuring of the output COL line from the sensor readout transistor associated with the sensing array element of Row(n+1).

Such operation further is illustrated in FIG. 19, which is a drawing that depicts the element array 100, with the liquid droplet 108 again spanning array elements in adjacent rows. A single Row(n) is selected by the value of (n) to which the gate line pulse on GL(n) is applied, and a single Column(m) is selected by the value of (m) to which the source line pulse SL(m) is perturbed, thereby selecting a perturbing array element 146. The row being sensed from which the COL output is measured, denoted as Row(o) in FIG. 19, may be different from or the same as Row(n).

Figure 20:
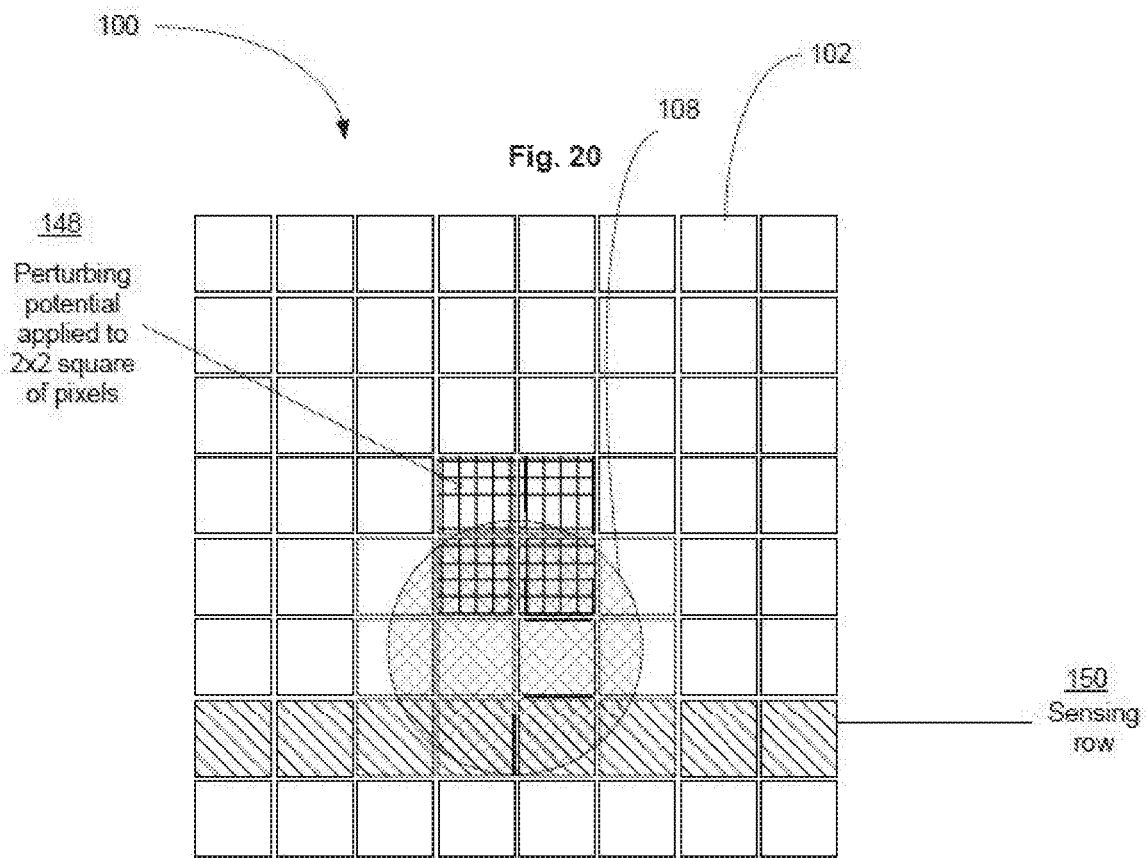
FIG. 20 is a drawing depicting the element array as operated in accordance with the timing diagram of FIG. 18, illustrating operation by perturbing a block of perturbing array elements and a sensing row from which the output is measured.

An advantage of this embodiment is more flexible configurability of the perturbing and sensing array elements. The position of any gaps between liquid droplets relative to the perturbing array element (n, m) may be assessed by measuring the impedance between the perturbing array element (n, m) and any other pixel in the element array 100 by appropriate selection of Row(o). In one variation, multiple array elements may be perturbed to enhance the sensing operation with a sensing array element in any selected Row(o). For example, FIG. 20 is a drawing depicting the element array 100 and illustrating an alternative arrangement whereby a block of 2×2 array elements 148 is perturbed and a selected sensing row 150 is sensed. The perturbing block of array elements generally can be any rectangle, as determined from the column source lines SL and row gate lines GL being addressed. This operation of perturbing multiple array elements may be useful as a method of enhancing the amplitude of the sensed signal that is measured from the COL output line of the sensing array element, thus increasing the sensing signal-to-noise ratio (SNR).

Figure 21:
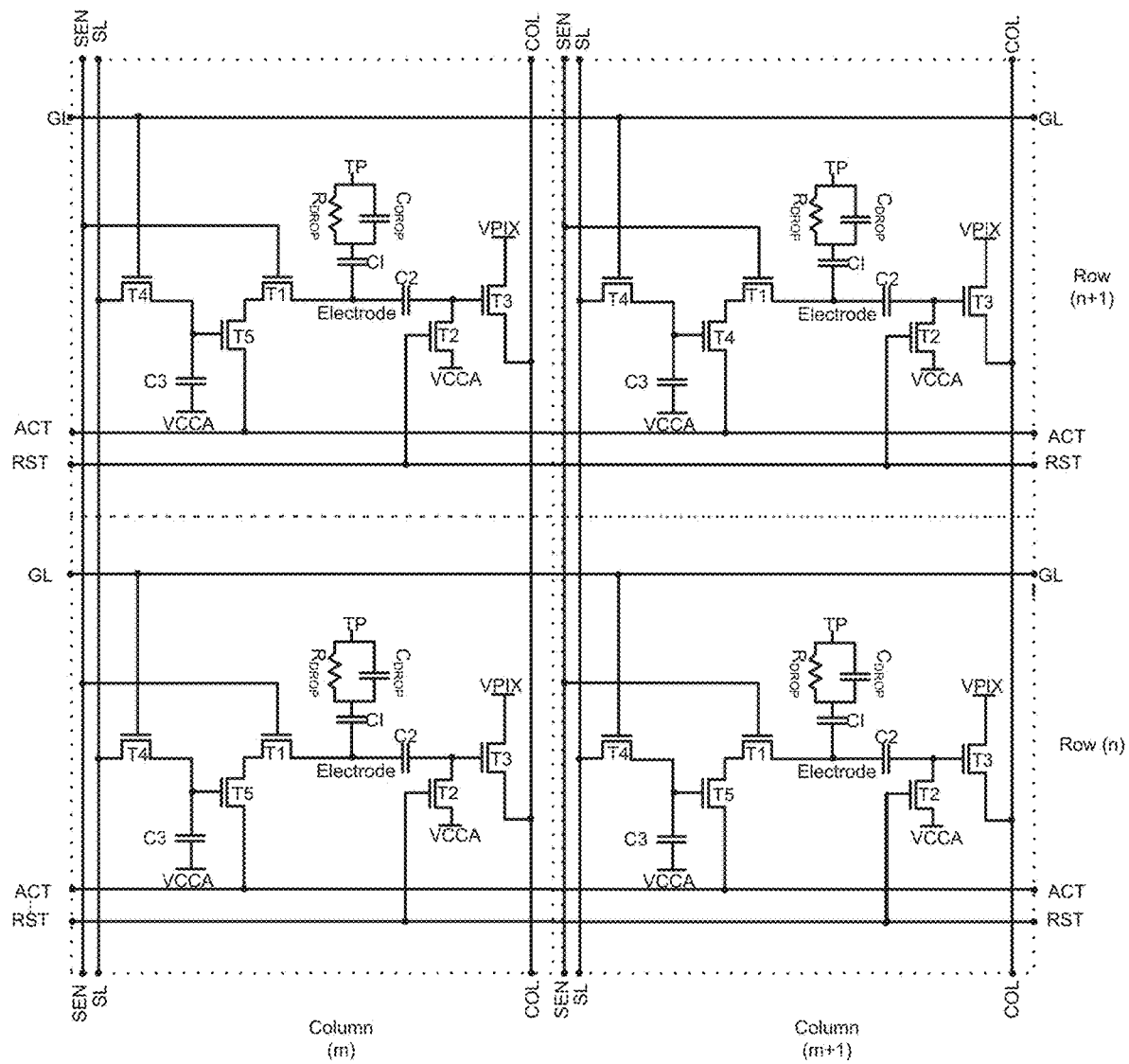
FIG. 21 is a drawing depicting a plurality of array elements including exemplary array element circuitry comparable to the array element circuity of FIG. 7.
Figure 22:
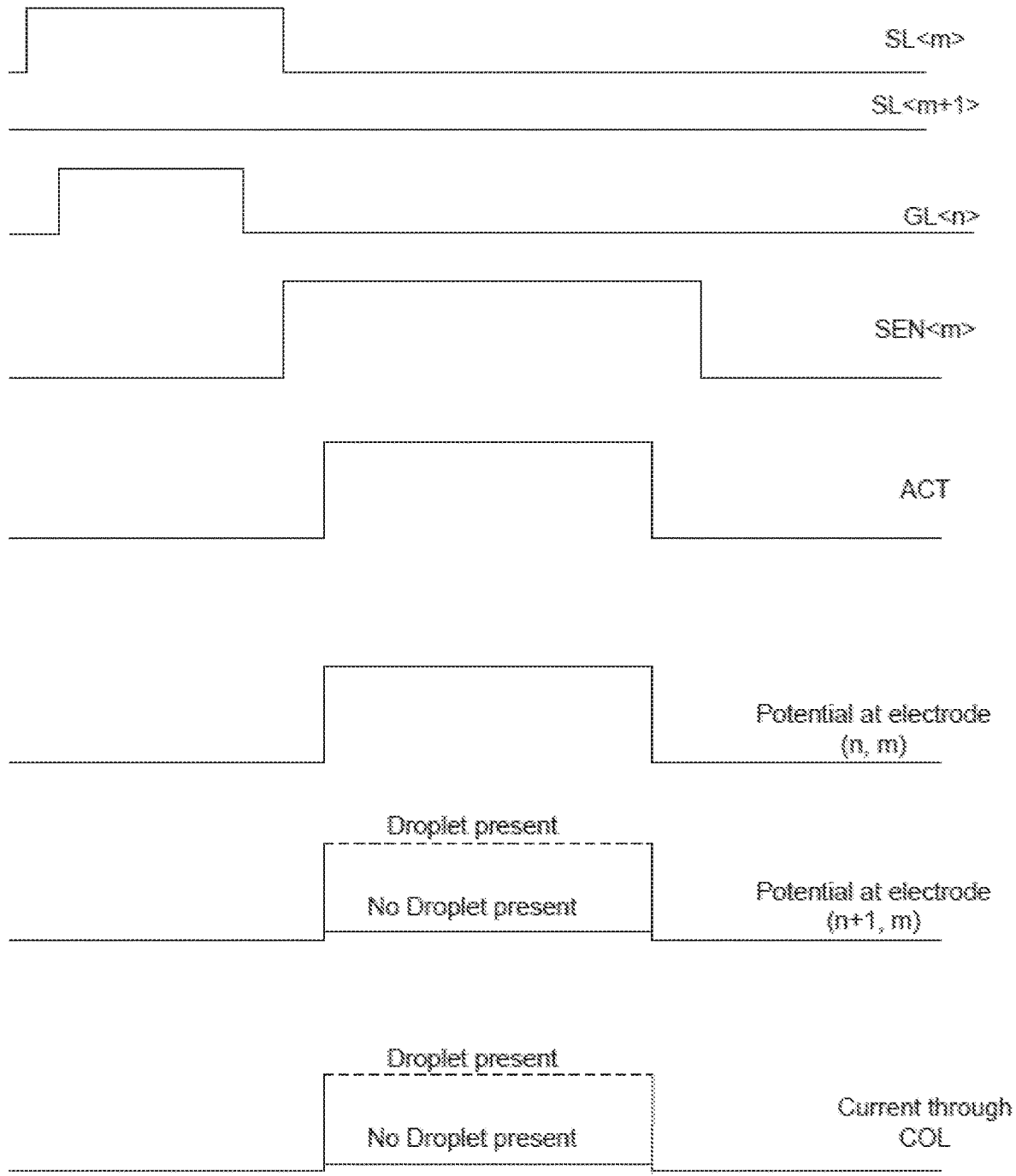
FIG. 22 is a drawing depicting a timing diagram that illustrates the operation of the embodiment of FIG. 21 in a mutual capacitance mode.

The described operation of using integrated impedance sensor circuitry in a mutual capacitance mode can be combined with any suitable actuation circuitry. For example, FIG. 21 is a drawing depicting a plurality of array elements including exemplary array element circuitry based on the circuit configuration depicted in FIG. 7. FIG. 22 is a timing diagram that illustrates the operation of the embodiment of FIG. 21. FIG. 21, therefore, also depicts a 2×2 portion of an element array arranged in a Column(m) and Column(m+1) positioned in adjacent rows, respectively Row(n) and Row (n+1). Similarly, as described with respect to FIG. 7, this basic array element circuit employs the five transistor arrangement (this example embodiment employs the variation in which the additional capacitor C1 connected to the RWS line is omitted), except with the drive transistor T1 being connected to a column addressing line SEN.

The principles of operation are similar to the previous embodiments, except with the perturbing signal to the perturbing array element being passed from the actuation line ACT through transistor T5. The reset signal in Row(n+1), RST(n+1), again is taken high to apply the initialization potential VCCA to the gate of the sensor readout transistor T3 as in previous embodiments. Referring to the timing diagram of FIG. 22, to pass the perturbing signal in Row(n) from line ACT through to the perturbing element electrode, the DRAM element including memory capacitor C3 must first be written high to ensure that T5 is switched on. Otherwise, operation is similar as previously described. As illustrated in the timing diagram of FIG. 22, a perturbing row is selected by operation of the gate line GL(n) for Row(n) and the SEN(m) line for Column(m). Such operation turns on transistors T1 and T4 in the perturbing array element. The source line SL(m) also is pulsed to take the DRAM element high to turn on T5 as referenced above. In this manner, perturbing array element (n, m) is selected, and the voltage at such array element electrode (n, m) is perturbed by applying a pulse to the actuation line ACT which is applied to the element electrode via transistors T5 and T1.

Sensing then proceeds similarly as in previous embodiments. As seen in FIG. 22, the perturbation of the array element electrode in element (m, n) couples to the array element electrode in Row(n+1), to an extent that depends on the presence and extent of coverage of a polar liquid droplet over the array elements in Row(n) and Row(n+1). The voltage perturbation in turn couples through the sensor capacitor C2 to the gate of the sensor readout transistor T3, from which an output current is read down the COL line. The extend of coupling is shown in the timing diagram of FIG. 22 in that the voltage pulse coupled to the array element electrode in Row(n+1) is greater when a liquid droplet spans the gap between array element electrodes of Row(n) and Row(n+1), as compared to when no liquid droplet spans the gap between array element electrodes of Row(n) and Row (n+1). This difference further is illustrated in the timing diagram of FIG. 22 in that the measured output current down the output column line COL is greater when a liquid droplet spans the gap between array element electrodes of Row(n) and Row(n+1), as compared to when no liquid droplet spans the gap between array element electrodes of Row(n) and Row(n+1). In this manner, the expanse of liquid droplet coverage ultimately may be determined by measuring of the output COL line from the sensor readout transistor associated with the sensing array element of Row(n+1).

Figure 7:
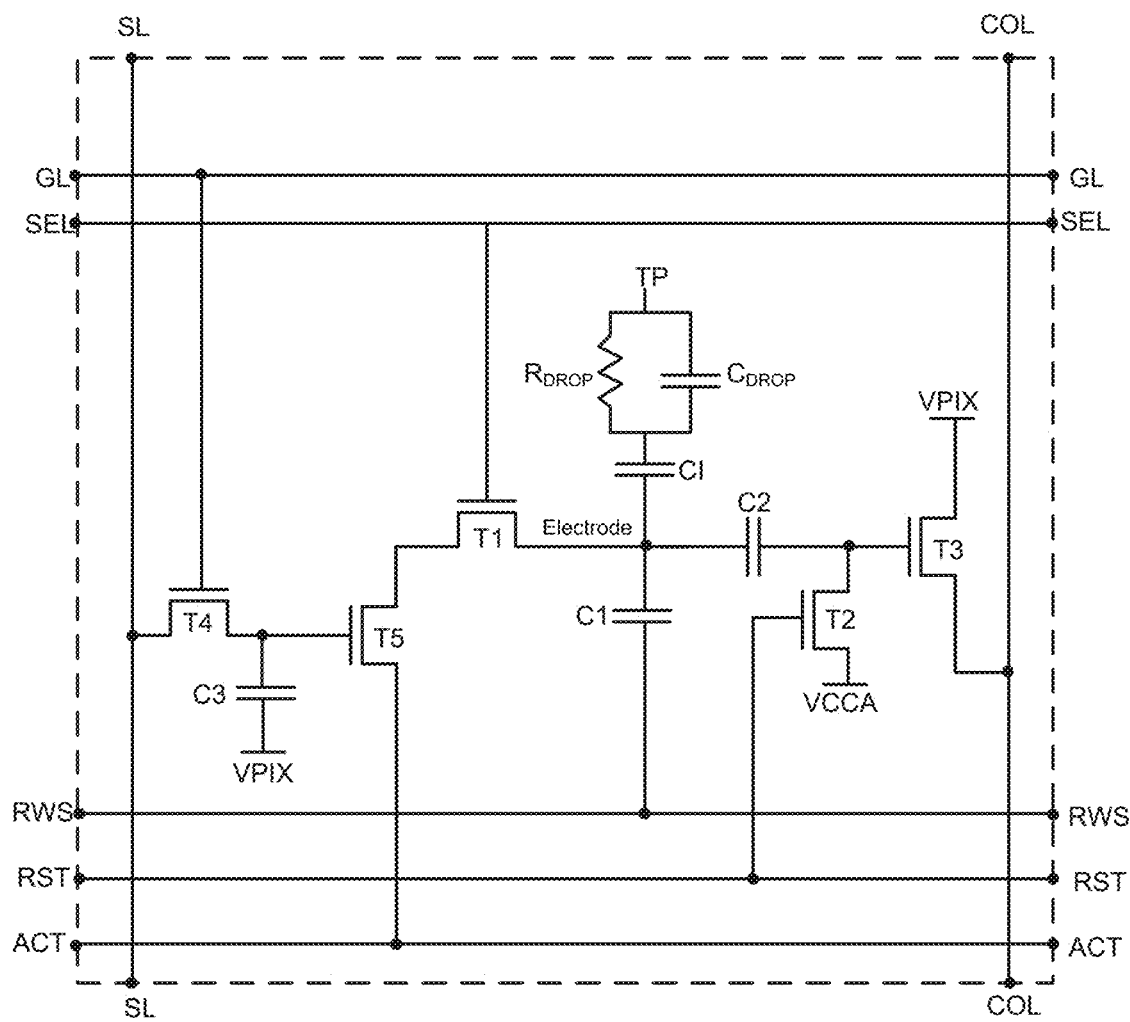
FIG. 7 is a drawing depicting an array element including exemplary array element circuitry for an AM-EWOD device that embodies another previous design of Applicant.
Figure 23:
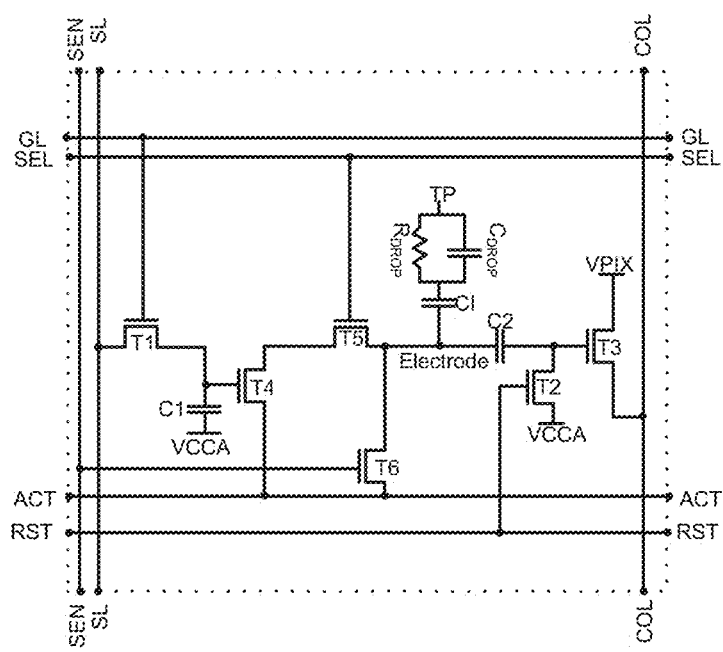
FIG. 23 is drawing depicting a variation of the circuitry of FIGS. 7 and 21, in which a sixth transistor is incorporated for applying the perturbing voltage.

As another example, FIG. 23 is drawing depicting a variation of the circuitry of FIGS. 7 and 21, in which a sixth transistor T6 is incorporated for applying the perturbing voltage from the actuation line ACT to the perturbing array element electrode. The gate of T6 is operated by pulsing a column addressing line SEN(m) to turn on T6 during the sensing phase. With T6 turned on, the perturbing pulse of the ACT line is applied to the array element electrode of Row(n). This configuration has an advantage in not requiring the memory element to be overwritten for sensing, at the cost of an extra transistor being added to the circuitry. Sensing otherwise proceeds generally comparable to previous embodiments.

Figure 8:
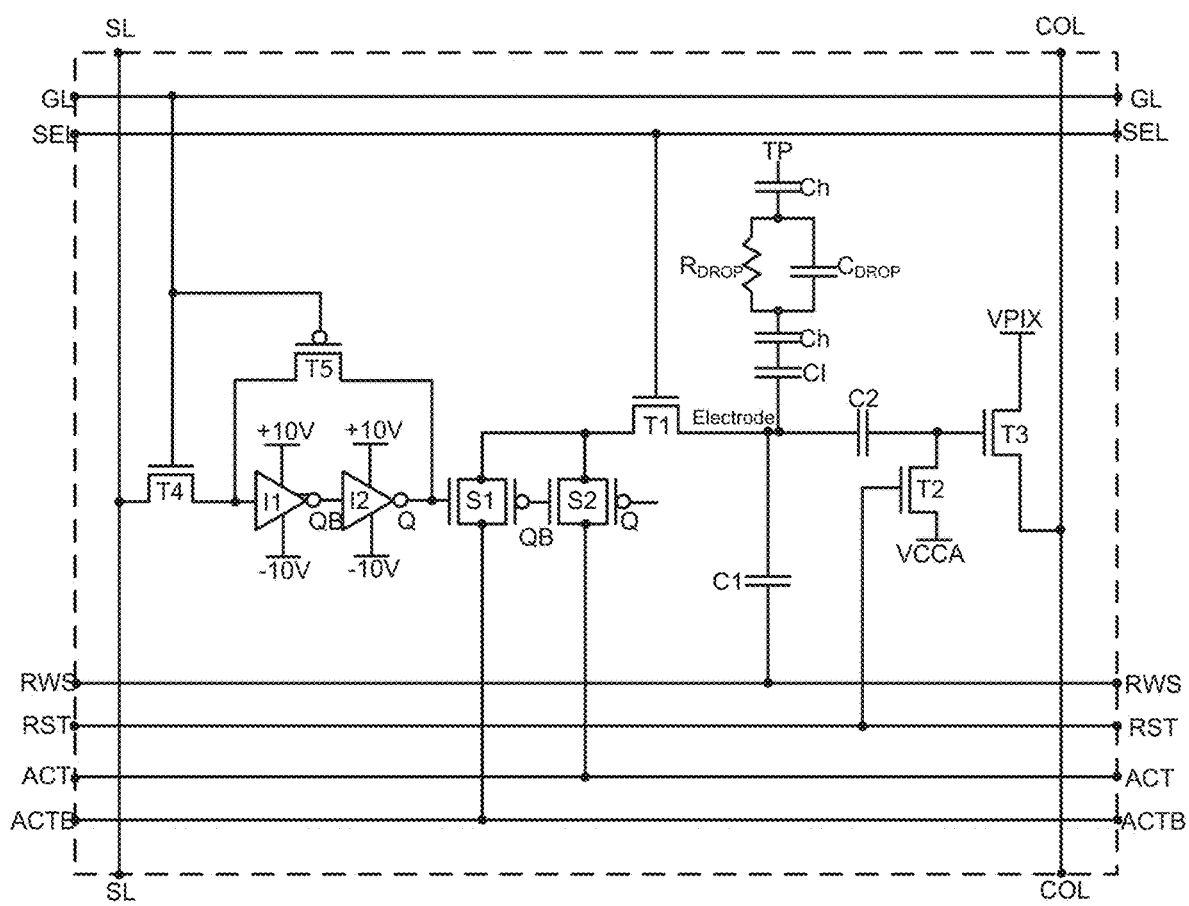
FIG. 8 is a drawing depicting an array element including exemplary array element circuitry for an AM-EWOD device that embodies another previous design of Applicant.
Figure 24:
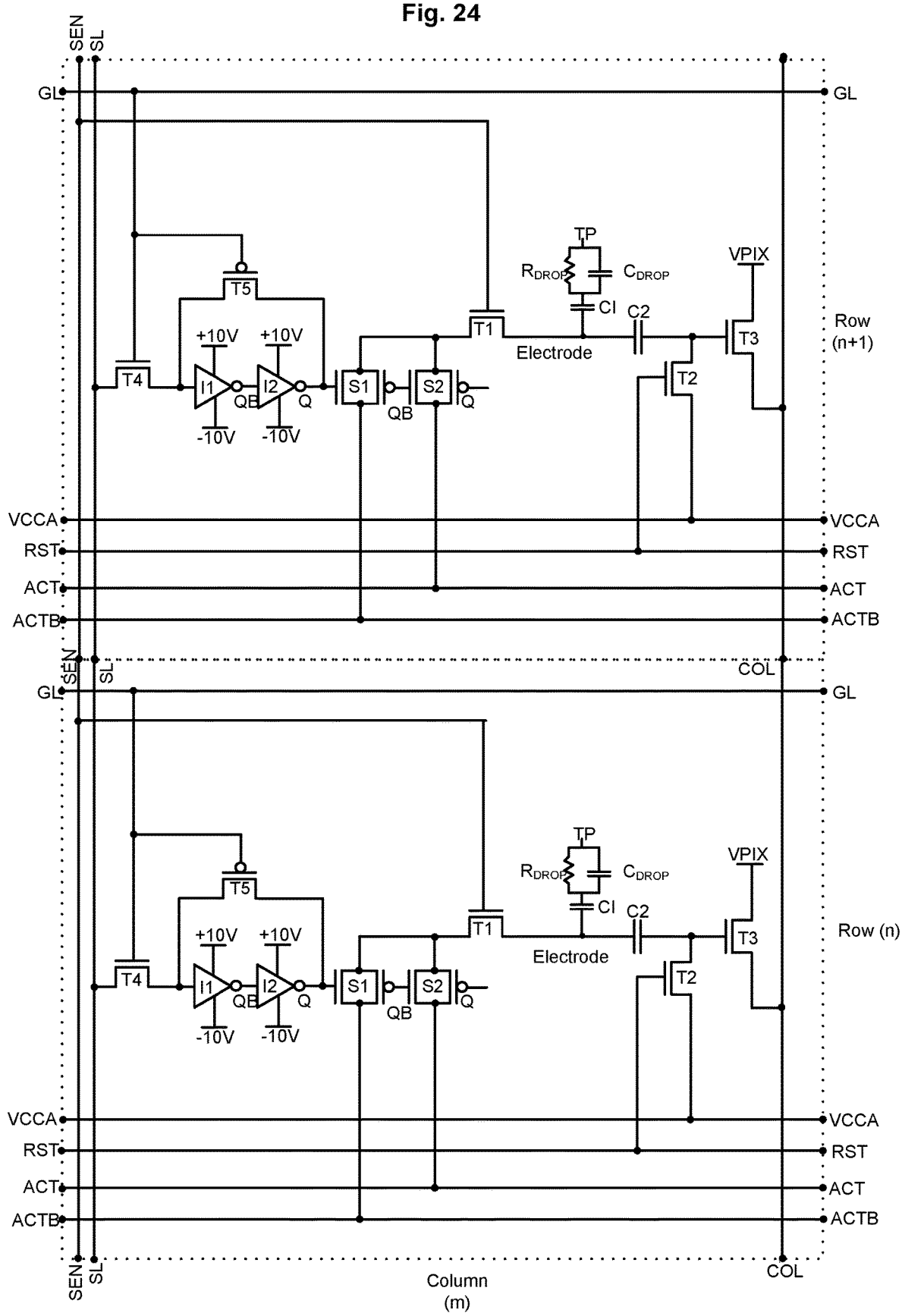
FIG. 24 is a drawing depicting a plurality of array elements including exemplary array element circuitry comparable to the array element circuity of FIG. 8.
Figure 25:
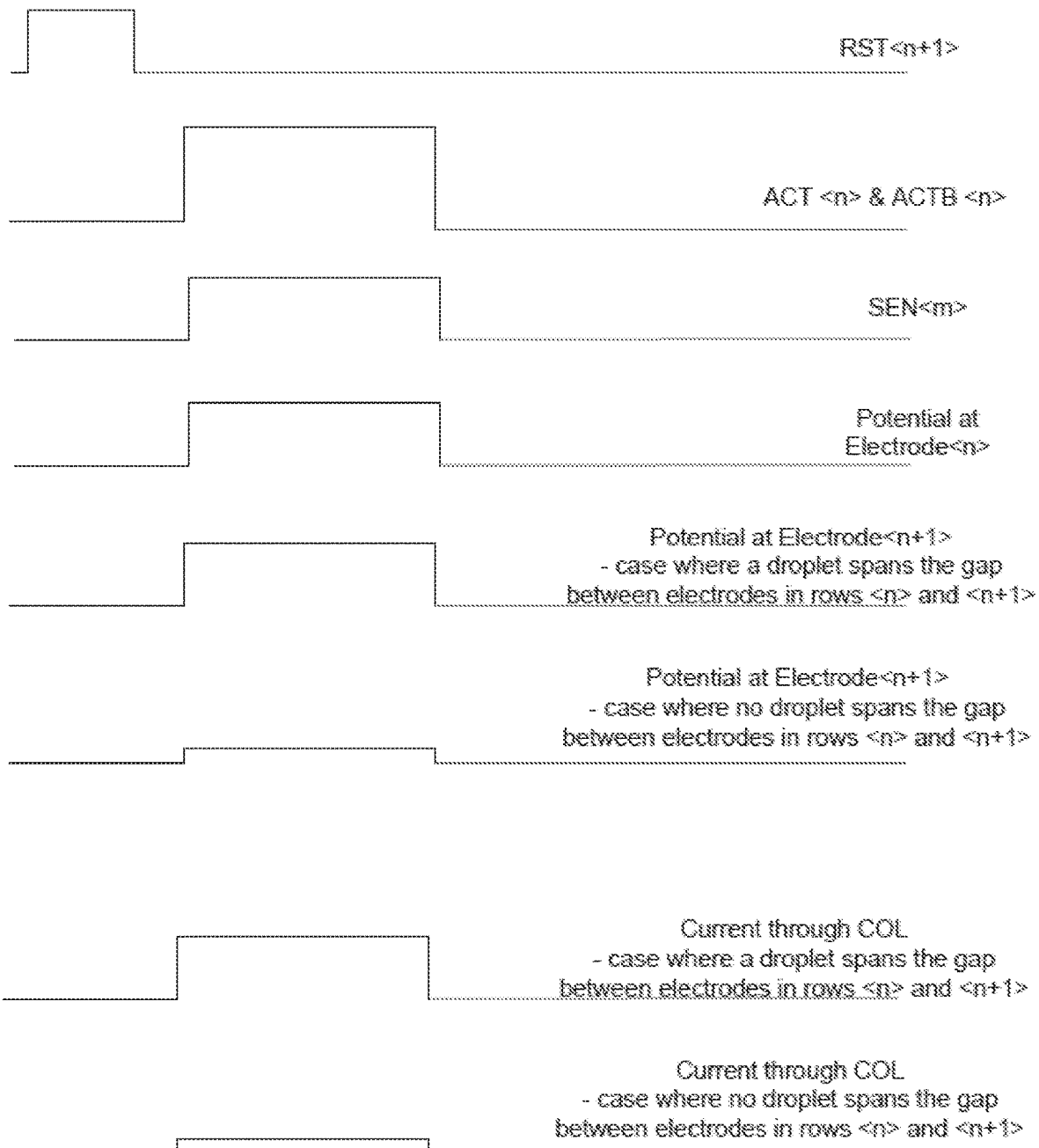
FIG. 25 is a drawing depicting a timing diagram that illustrates the operation of the embodiment of FIG. 24 in a mutual capacitance mode.

As another example, FIG. 24 is a drawing depicting a plurality of array elements including exemplary array element circuitry based on the circuit configuration depicted in FIG. 8. FIG. 25 is a timing diagram that illustrates the operation of the embodiment of FIG. 24 in a mutual capacitance mode. FIG. 24 depicts a 2×1 portion of an element array arranged in a Column(m) and positioned in adjacent rows, respectively Row(n) and Row(n+1). Similarly as described with respect to FIG. 8, this embodiment uses the three transistor impedance sensor circuitry combined with an actuation circuit and memory function incorporating an SRAM cell, except with the drive transistor T1 being connected to a column addressing line SEN. As with previous embodiments, a voltage perturbation is applied to the element electrode at Row(n) with the output being measured off of the sensor readout transistor T3 of Row(n+1).

Referring to the timing diagram of FIG. 25, the reset signal in Row(n+1), RST(n+1), is taken high to apply the initialization potential VCCA to the gate of the sensor readout transistor T3 as in previous embodiments. The SEN(m) line is pulsed along with pulsing the two actuation lines ACT(n) and ACTB(n). The ACT and ACTB addressing lines of the Row(n) being perturbed are driven in common. Because only one of switches S1 and S2 is switched on at any time (in accordance with whether the SRAM is written "1" or "0"), the common signal on ACT/ACTB regardless is passed through one of S1 and S2, and ultimately to the element electrode through the drive transistor T1 as T1 also is turned on by the pulsing of the addressing line SEN(m). Accordingly, the potential at the element electrode of the array element of Row(n) is boosted high in said Row(n).

Sensing then proceeds similarly as in previous embodiments. As seen in FIG. 25, the perturbation of the array element electrode in element (m, n) couples to the array element electrode in Row(n+1), to an extent that depends on the presence and extent of coverage of a polar liquid droplet over the array elements in Row(n) and Row(n+1). The voltage perturbation in turn couples through the sensor capacitor C2 to the gate of the sensor readout transistor T3, from which an output current is read down the COL line. The extent of coupling is shown in the timing diagram of FIG. 25 in that the voltage pulse coupled to the array element electrode in Row(n+1) is greater when a liquid droplet spans the gap between array element electrodes of Row(n) and Row(n+1), as compared to when no liquid droplet spans the gap between array element electrodes of Row(n) and Row (n+1). This difference further is illustrated in the timing diagram of FIG. 25 in that the measured output current down the output column line COL is greater when a liquid droplet spans the gap between array element electrodes of Row(n) and Row(n+1), as compared to when no liquid droplet spans the gap between array element electrodes of Row(n) and Row(n+1). In this manner, the expanse of liquid droplet coverage ultimately may be determined by measuring of the output COL line from the sensor readout transistor associated with the sensing array element of Row(n+1).

The circuit configuration of FIG. 24 can be driven to achieve the operational result comparably as illustrated in FIG. 19 described above, wherein the perturbed array element(s) are of arbitrary values of column "m" and row "n" on the device array. A variant of this embodiment would be to connect the gate of drive transistor T1 to a row addressing line. In such configuration, an operational result comparably as described above with respect to FIG. 11 would be achieved, wherein entire rows are perturbed at the same time.

FIG. 26 is a drawing depicting a timing diagram illustrating timing signals for exemplary operation in accordance with embodiments of the present invention. In accordance with any of the previous embodiments, the perturbation voltage may be applied as a high frequency pulse train, as shown in FIG. 26 as exemplified by the depiction of RWS (n). A comparable pulse train may be applied as the perturbing voltage via other addressing lines in accordance with any of the above embodiments.

For a high frequency pulse train, the coupling of the voltage perturbation from the perturbing array element electrode to the sensing array element electrode is more strongly dependent on the electrical resistivity of the material comprising the polar liquid droplet (if such a polar liquid droplet is present). In particular, for a higher conductivity liquid droplet, the high frequency perturbation signal couples more strongly through the liquid droplet, and in essence the output signal waveform essentially corresponds to the perturbation voltage waveform, as seen in the portion of FIG. 26 corresponding to the presence of a liquid droplet of high conductivity. In contrast, for a lower conductivity liquid droplet, the high frequency perturbation voltage waveform couples more weakly through the liquid droplet, and in essence the edges of the output signal are skewed by the resistive component of the liquid droplet. Equivalently, the behavior of a low conductivity droplet follows an RC model of the liquid droplet acting as a low pass filter, which is illustrated in the bottom portion of the FIG. 26 corresponding to the presence of a liquid droplet of low conductivity.

Consequently, the detected output signal for sensing is a function of the frequency of the perturbing voltage pulse train and the resistivity of the liquid droplet that may be present. Accordingly, by appropriate choice of perturbation voltage frequency, this mode of driving may be used to detect the resistivity of the liquid droplet. The choice of perturbation voltage frequency will be dependent on the overall system geometry, including the size of the liquid droplets to be used and the height of the device channel gap. The selected frequency typically may be in the range of 1 kHz-1 MHz, which permits detecting droplet conductivities in the range of 0.001-1 mS/cm. An example application in which sensing droplet conductivity is useful is a conductive assay, for example as described in U.S. Pat. No. 5,202,261. Such an assay may be used in a test diagnostic device to determine the presence or concentration of a predetermined analyte in a liquid test sample, wherein the predetermined analyte is assayed by an oxidase interaction resulting in a change of the droplet conductivity.

An aspect of the invention, therefore, is a method of operating an active matrix electro-wetting on dielectric (AM-EWOD) device that provides for enhanced mutual capacitance sensing using integrated impedance sensing circuitry. In exemplary embodiments, the AM-EWOD device includes a plurality of array elements arranged in an array of rows and columns, each of the array elements including array element circuitry and an array element electrode. The array element circuitry of each array element includes actuation circuitry configured to apply actuation voltages to the array element electrode for actuating the array element, and impedance sensor circuitry integrated into the array element circuitry and configured to sense impedance at the array element electrode, the impedance sensor circuitry comprising a sensor capacitor and a sensor readout transistor that outputs an output current for sensing. The method of operating includes the steps of: perturbing a voltage applied to the array element electrode of a first array element; coupling the voltage perturbation to the array element electrode of a second array element different from the first array element; and measuring the output current from the sensor readout transistor of the second array element for sensing in response to the voltage perturbation. The method according to any of the embodiments may be performed by an AM-EWOD control system executing program code stored on a non-transitory computer readable medium. The method of operating may include one or more of the following features, either individually or in combination.

In an exemplary embodiment of the method of operating, the array element circuitry of each array element further comprises a storage capacitor connected to the array element electrode, and the voltage perturbation comprises perturbing a voltage input to the storage capacitor of the first array element that is coupled to the array element electrode of the first array element.

In an exemplary embodiment of the method of operating, the input to the storage capacitor is applied via a row addressing line.

In an exemplary embodiment of the method of operating, the input to the storage capacitor is applied via a column addressing line.

In an exemplary embodiment of the method of operating, the voltage perturbation comprises perturbing a voltage input to the drive transistor of the first array element that is coupled to the array element electrode of the first array element.

In an exemplary embodiment of the method of operating, the array element circuitry further comprises a second transistor different from the drive transistor that is connected to the array element electrode, and the voltage perturbation comprises perturbing a voltage input to the second transistor of the first array element that is coupled to the array element electrode of the first array element.

In an exemplary embodiment of the method of operating, the method further includes, prior to perturbing the voltage applied to the array element electrode of the first array element, resetting a voltage at a gate of the sensor readout transistor of the second array element to an initialization voltage that turns off the sensor readout transistor of the second array element.

In an exemplary embodiment of the method of operating, the voltage perturbation is coupled from the array element electrode of the second array element to the sensor readout transistor of the second array element through the sensor capacitor of the second array element.

In an exemplary embodiment of the method of operating, the first array element and the second array element are in different rows.

In an exemplary embodiment of the method of operating, the first array element and the second array element are in different columns.

In an exemplary embodiment of the method of operating, the first array element and the second array element are adjacent array elements within the array.

In an exemplary embodiment of the method of operating, the first array element and the second array element are non-adjacent array elements within the array.

In an exemplary embodiment of the method of operating, the method further includes perturbing the voltage applied to array element electrodes of a plurality of first array elements; coupling the voltage perturbation to the array element electrode of a second array element different from the plurality of first array elements; and measuring the output current from the sensor readout transistor of the second array element for sensing in response to the voltage perturbation.

In an exemplary embodiment of the method of operating, the method further includes determining whether a polar liquid droplet spans a gap between the first array element and the second array element based on the measured output current.

In an exemplary embodiment of the method of operating, the method further includes determining whether a first polar liquid droplet and a second polar liquid droplet have merged based on the measured output current.

In an exemplary embodiment of the method of operating, the method further includes determining whether a droplet interface bilayer has formed between the first polar liquid droplet and the second liquid droplet based on the measured output current.

In an exemplary embodiment of the method of operating, the voltage perturbation comprises a pulse train.

In an exemplary embodiment of the method of operating, a frequency of the pulse train is in a range of 1 kHz to 1 MHz.

In an exemplary embodiment of the method of operating, the method further includes determining a conductivity of a polar liquid droplet based on the measured output current.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The described embodiments could be used to provide an enhance AM-EWOD device. The AM-EWOD device could form a part of a lab-on-a-chip system. Such devices could be used for optical detection of biochemical or physiological materials, such as for cell detection and cell counting. Applications include healthcare diagnostic testing, material testing, chemical or biochemical material synthesis, proteomics, tools for research in life sciences and forensic science.

REFERENCE SIGNS LIST

32—reader
34—cartridge
35—external sensor module
36—AM-EWOD device
38—control electronics
40—storage device
4—lower substrate assembly
46—thin film electronics
48—array element electrodes
48A—array element electrode
48B—array element electrode
50—two-dimensional element array
51—array element
52—liquid droplet
54—top substrate
56—spacer
58—reference electrode
60—non-polar fluid
62—insulator layer
64—first hydrophobic coating
66—contact angle
68—second hydrophobic coating
70A—electrical load with droplet present
70B—electrical load without droplet present
72—array element circuit
74—integrated row driver
76—column driver
78—integrated sensor row addressing
80—column detection circuits
82—serial interface
84—voltage supply interface
86—connecting wires
100—exemplary element array
102—array elements
104—perturbing row
106—sensing row
108—liquid droplet
110—channel gap
112—first hydrophobic coating
114—second hydrophobic coating
116—non-polar fluid/oil
118—first array element electrode
120—second array element electrode
122—insulator layer
124—top or reference electrode
128—single merged droplet
128a—first droplet
128b—second droplet
130—gap between droplets
132—non-electrode substrate layer
134a—first droplet
134b—second droplet
136—small gap between droplets 138—droplet interface bilayer
140—perturbing column
142—sensing row
144—array element
146—perturbing array element
148—array elements
150—sensing row

What is claimed is:

1. A method of operating an active matrix electro-wetting on dielectric (AM-EWOD) device,
wherein the AM-EWOD device comprises a plurality of array elements arranged in an array of rows and columns, each of the plurality of array elements including array element circuitry and an array element electrode; and
wherein the array element circuitry of each array element comprises actuation circuitry configured to apply actuation voltages to the array element electrode for actuating the array element, and impedance sensor circuitry integrated into the array element circuitry and configured to sense impedance at the array element electrode, the impedance sensor circuitry comprising a sensor capacitor and a sensor readout transistor that outputs an output current for sensing;
the method of operating comprising the steps of:
perturbing a voltage applied to the array element electrode of a first array element from among the plurality of array elements;
coupling the voltage perturbation to the array element electrode of a second array element from among the plurality of array elements different from the first array element; and
measuring the output current from the sensor readout transistor of the second array element for sensing in response to the voltage perturbation.

2. The method of operating of claim 1, wherein the array element circuitry of each array element further comprises a storage capacitor connected to the array element electrode, and the voltage perturbation comprises perturbing a voltage input to the storage capacitor of the first array element that is coupled to the array element electrode of the first array element.

3. The method of operating of claim 2, wherein the input to the storage capacitor is applied via a row addressing line.

4. The method of operating of claim 2, wherein the input to the storage capacitor is applied via a column addressing line.

5. The method of operating of claim 1, wherein the voltage perturbation comprises perturbing a voltage input to the drive transistor of the first array element that is coupled to the array element electrode of the first array element.

6. The method of operating of claim 1, wherein the array element circuitry further comprises a second transistor different from the drive transistor that is connected to the array element electrode, and the voltage perturbation comprises perturbing a voltage input to the second transistor of the first array element that is coupled to the array element electrode of the first array element.

7. The method of operating of claim 1, further comprising, prior to perturbing the voltage applied to the array element electrode of the first array element, resetting a voltage at a gate of the sensor readout transistor of the second array element to an initialization voltage that turns off the sensor readout transistor of the second array element.

8. The method of operating of claim 1, wherein the voltage perturbation is coupled from the array element electrode of the second array element to the sensor readout transistor of the second array element through the sensor capacitor of the second array element.

9. The method of operating of claim 1, wherein the first array element and the second array element are in different rows.

10. The method of operating of claim 1, wherein the first array element and the second array element are in different columns.

11. The method of operating of claim 1, wherein the first array element and the second array element are adjacent array elements within the array.

12. The method of operating of claim 1, wherein the first array element and the second array element are non-adjacent array elements within the array.

13. The method of operating of claim 1, wherein the plurality of array elements includes a plurality of first array elements, the method comprising:
perturbing the voltage applied to array element electrodes of the plurality of first array elements;
coupling the voltage perturbation to the array element electrode of the second array element, wherein the second array element is different from each of the plurality of first array elements; and
measuring the output current from the sensor readout transistor of the second array element for sensing in response to the voltage perturbation.

14. The method of operating of claim 1, further comprising determining whether a polar liquid droplet spans a gap between the first array element and the second array element based on the measured output current.

15. The method of operating of claim 1, further comprising determining whether a first polar liquid droplet and a second polar liquid droplet have merged based on the measured output current.

16. The method of operating of claim 15, further comprising determining whether a droplet interface bilayer has formed between the first polar liquid droplet and the second liquid droplet based on the measured output current.

17. The method of operating of claim 1, wherein the voltage perturbation comprises a pulse train.

18. The method of operating of claim 17, wherein a frequency of the pulse train is in a range of 1 kHz to 1 MHz.

19. The method of operating of claim 17, further comprising determining a conductivity of a polar liquid droplet based on the measured output current.

20. An active matrix electro-wetting on dielectric (AM-EWOD) system comprising:
an AM-EWOD device comprising a plurality of array elements arranged in an array of rows and columns, each of the plurality of array elements including array element circuitry and an array element electrode;
wherein the array element circuitry of each array element comprises actuation circuitry configured to apply actuation voltages to the array element electrode for actuating the array element, and impedance sensor circuitry integrated into array element circuitry and configured to sense impedance at the array element electrode, the impedance sensor circuitry comprising a sensor capacitor and a sensor readout transistor that outputs an output current for sensing; and
a control system configured to operate the AM-EWOD device by the steps of:
perturbing a voltage applied to the array element electrode of a first array element from among the plurality of array elements;

wherein the voltage perturbation is coupled to the array element electrode of a second array element from among the plurality of array elements different from the first array element; and measuring the output current from the sensor readout transistor of the second array element for sensing in response to the voltage perturbation.

21. The AM-EWOD system of claim 20, wherein the control system further is configured to operate the AM-EWOD device to perform the method of claim 2.

22. The AM-EWOD device of claim 20, wherein the plurality of array elements arranged in the array of rows and columns has an in-plane electrode structure.

23. A non-transitory computer readable medium for use with an active matrix electro-wetting on dielectric (AM-EWOD) device, wherein the AM-EWOD device comprises a plurality of array elements arranged in an array of rows and columns, each of the plurality of array elements including array element circuitry and an array element electrode; and wherein the array element circuitry of each array element comprises actuation circuitry configured to apply actuation voltages to the array element electrode for actuating the array element, and impedance sensor circuitry integrated into array element circuitry and configured to sense impedance at the array element electrode, the impedance sensor circuitry comprising a sensor capacitor and a sensor readout transistor that outputs an output current for sensing;

the non-transitory computer readable medium storing program code which when executed by a computer performs the steps of:

perturbing a voltage applied to the array element electrode of a first array element from among the plurality of array elements;

wherein the voltage perturbation is coupled to the array element electrode of a second array element from among the plurality of array elements different from the first array element; and measuring the output current from the sensor readout transistor of the second array element for sensing in response to the voltage perturbation.

24. The non-transitory computer readable medium of claim 22, wherein the program code is executed by the computer further to perform the method of claim 2.

* * * * *